United States Patent
Asami

(10) Patent No.: US 7,768,014 B2
(45) Date of Patent: Aug. 3, 2010

(54) MEMORY DEVICE AND MANUFACTURING METHOD THEREOF

(75) Inventor: Yoshinobu Asami, Atsugi (JP)

(73) Assignee: Semiconductor Energy Laboratory Co., Ltd., Atsugi-shi, Kanagawa-ken ( * ) Notice: Subject to any disclaimer, the term of this patent is extended or adjusted under 35 U.S.C. 154(b) by 0 days.

(21) Appl. No.: 11/337,554

(22) Filed: Jan. 24, 2006

(65) Prior Publication Data

US 2006/0175648 A1 Aug. 10, 2006

(30) Foreign Application Priority Data

Jan. 31, 2005 (JP) ............... 2005-024629

(51) Int. Cl.
*H01L 27/108* (2006.01)
*H01L 29/00* (2006.01)
(52) U.S. Cl. ............... 257/68; 257/71; 257/296; 257/306; 257/E27.085
(58) Field of Classification Search ............... 257/68, 257/71, 296, 306, E27.084, E27.085, E27.016, 257/E27.034
See application file for complete search history.

(56) References Cited

U.S. PATENT DOCUMENTS

| 5,850,090 A * | 12/1998 | Oashi et al. ............... 257/296 |
| 6,384,439 B1 * | 5/2002 | Walker ............... 257/296 |
| 7,113,420 B2 * | 9/2006 | Krieger et al. ............... 365/151 |
| 2001/0054727 A1 * | 12/2001 | Hofmann et al. ............... 257/296 |
| 2002/0053692 A1 * | 5/2002 | Shrivastava et al. ............... 257/306 |
| 2002/0056864 A1 * | 5/2002 | Agarwal ............... 257/296 |
| 2002/0074584 A1 * | 6/2002 | Yang ............... 257/300 |
| 2002/0105050 A1 * | 8/2002 | Hagiwara et al. ............... 257/529 |
| 2002/0145140 A1 * | 10/2002 | Katayama ............... 257/59 |
| 2004/0051096 A1 | 3/2004 | Kingsborough et al. |
| 2005/0082540 A1 * | 4/2005 | Nishikawa ............... 257/72 |

FOREIGN PATENT DOCUMENTS

| JP | 56-091464 | 7/1981 |
| JP | 2000-020665 | 1/2000 |

OTHER PUBLICATIONS

Office Action (Application No. 200610006976.5) dated Jun. 27, 2008.

* cited by examiner

*Primary Examiner*—Sue Purvis
*Assistant Examiner*—Leslie Pilar Cruz
(74) *Attorney, Agent, or Firm*—Eric J. Robinson; Robinson Intellectual Property Law Office, P.C.

(57) ABSTRACT

As for a memory element implemented in a semiconductor device typified by an RFID, it is an object of the present invention to reduce manufacturing steps and to provide a memory element and a memory circuit having the element with reduced cost. It is a feature of the present invention that a memory element sandwiched between electrodes has an organic compound, and an electrode connected to a semiconductor element controlling the memory element functions as an electrode of the memory element. In addition, an extremely thin semiconductor film formed on an insulated surface is used for the memory element; therefore cost can be reduced.

33 Claims, 16 Drawing Sheets

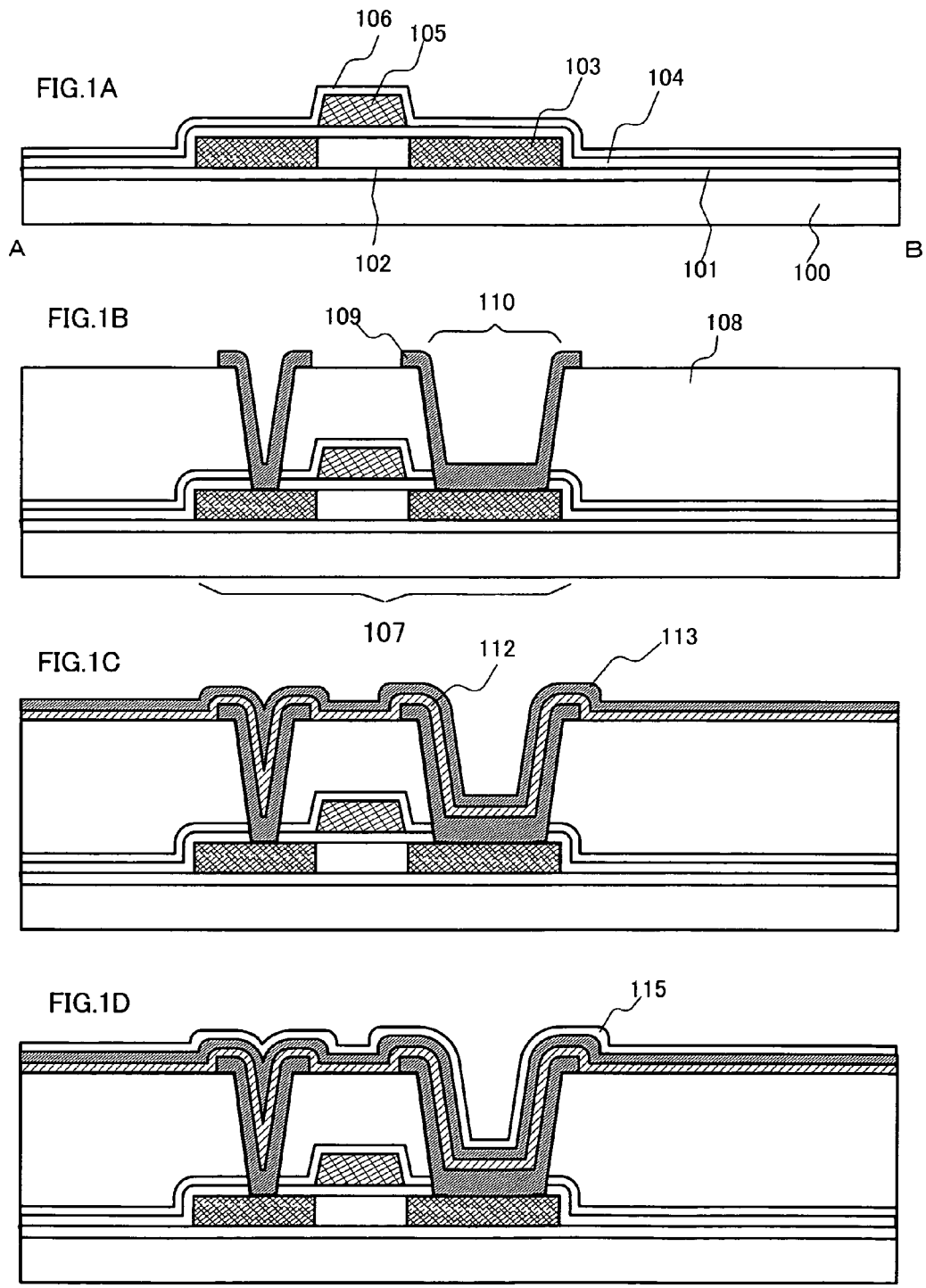

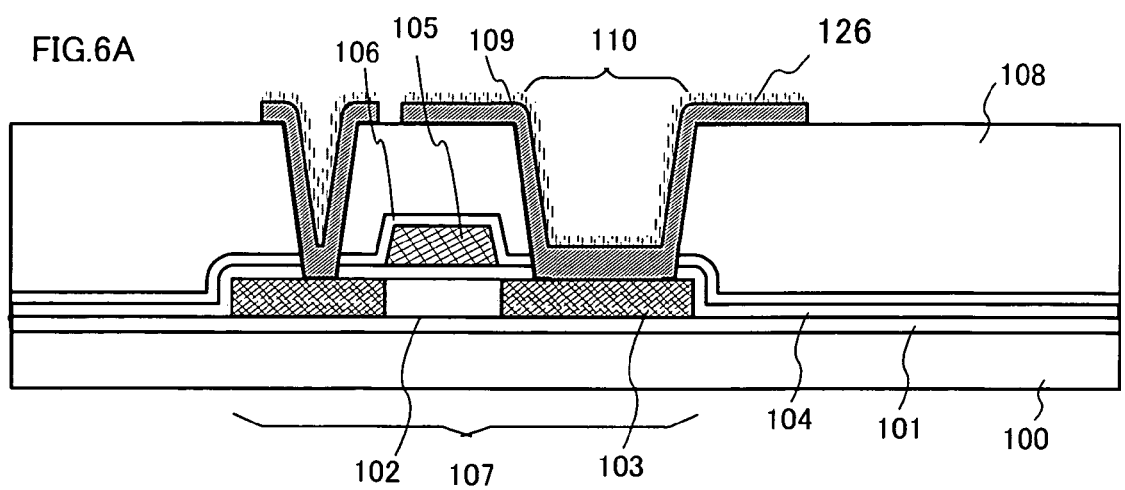
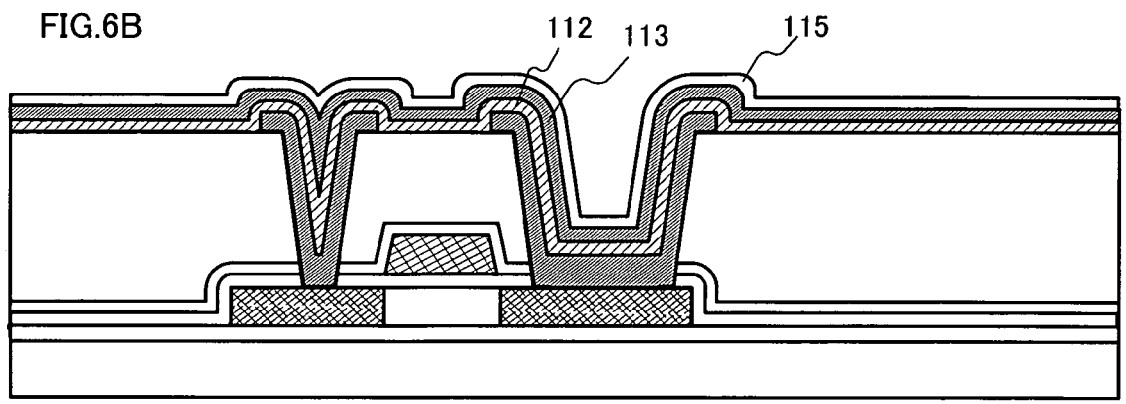

MEMORY DEVICE AND MANUFACTURING METHOD THEREOF

BACKGROUND OF THE INVENTION

1. Field of the Invention

The present invention will describe a memory element having an organic compound, a memory device having the memory element, and a method for manufacturing them.

2. Description of the Related Art

In these days, an RFID (Radio Frequency Identification) has been developed and researched as a technology to recognize and identify things and people. Such the RFID is used to prevent counterfeiting of securities or to identify individual, and many applications are expected.

An IC (Integrated Circuit) chip formed using a silicon wafer is used for the conventional RFID, and it forms a memory circuit such as ROM or RAM, a control circuit such as CPU (refer to Patent Document 1).

Patent Document 1
Japanese Patent Laid-Open No. 2000-20665 (FIG. 2)

As described above, a chip of an RFID which is formed using a silicon wafer is non-transmissive. Further, the size of a chip tends to be made smaller in order to increase impact resistance, however the chip is not considered to be thinned, and when it is mounted for securities or an individual identification, it is often noticeable.

Such the RFID is considered to be used for an area of a tag for goods, and its cost is expected to be lowered so that it is disposable. Therefore, the RFID is formed by taking out many planes from a silicon wafer having a circular shaped mother body, however limit for lowering the cost with increasing a taking-out efficiency has begun to appear.

It is an object of the present invention to provide a memory element and a memory circuit having the element with lowered cost and reduced manufacturing steps. In addition, it is an object of the present invention to provide a memory element having the circuit and a semiconductor device having the memory element.

SUMMARY OF THE INVENTION

In view of the objects described above, the present invention has a feature of a memory element having an organic compound sandwiched between electrodes, and an electrode connected to a semiconductor element which controls the memory element, in other words a source or drain electrode, functioning as a lower electrode of the memory element. Accordingly, an electrode for a memory element is not necessary, and thus the number of steps can be reduced.

In an aspect of the present invention, an insulator included in a memory element is formed inside an opening portion for forming an electrode electrically connected to a semiconductor element. Accordingly, an insulating film, and a so-called isolating layer, which is necessary for making and dividing an organic compound, is not formed.

In addition, an extremely thin semiconductor film formed on an insulated surface is used in the present invention; therefore low cost can be attempted. The insulated surface indicates other than a silicon wafer, for example a surface of a glass substrate or a synthetic resin substrate such as plastic.

Hereinafter, specific modes of the present invention will be described.

In an aspect of the present invention, a memory device includes a semiconductor film having an impurity region formed on an insulated surface; an insulating film which is in contact with the semiconductor film and provided with an opening portion on the impurity region; a conductive film functioning as a source or drain electrode electrically connected to the impurity region and functioning as a lower electrode at the opening portion; an insulator provided on the conductive film at the opening portion; and an upper electrode provided on the insulator.

In another aspect of the present invention, a memory device includes a semiconductor film having an impurity region formed on an insulated surface; a first insulating film which is in contact with the semiconductor film and provided with a first opening portion on the impurity region; a first conductive film functioning as a source or drain electrode electrically connected to the impurity region at the first opening portion; a second insulating film which is provided so as to cover the edge of the conductive film and provided with a second opening portion on the impurity region; a second conductive film which is connected to the first conductive film and functions as a lower electrode; an insulator provided on the second conductive film at the first and second opening portions; and an upper electrode provided on the insulator.

In the present invention, an insulator is a material whose property is changed by an optical effect or a thermal effect, and which can short-circuit a lower electrode and an upper electrode. In order to change the property by the optical effect or the thermal effect, the film thickness may be 5 to 100 nm, preferably 10 to 60 nm. In a case of using an organic compound material for the insulator, the glass transition temperature may be 80 to 300° C., preferably 100 to 250° C.

A method for manufacturing a memory device of the present invention is characterized by forming an impurity region in a semiconductor film on an insulated surface; forming an insulating film to be in contact with the semiconductor film; forming an opening portion in the insulating film so as to expose the impurity region; forming a conductive film functioning as a source or drain electrode and a lower electrode electrically connected to the impurity region at the opening portion; forming an insulator on the conductive film; and forming an upper electrode on the insulator.

Another mode of a method for manufacturing a memory device of the present invention is characterized by forming an impurity region in a semiconductor film on an insulated surface; forming an insulating film to be in contact with the semiconductor film; forming an opening portion in the insulating film so as to expose the impurity region; forming a conductive film functioning as a source or drain electrode and a lower electrode electrically connected to the impurity region at the opening portion; forming an insulator on the conductive film; and forming an upper electrode on the insulator, wherein surface modification is carried out to the conductive film and the insulating film.

Another mode of a method for manufacturing a memory device of the present invention is characterized by forming an impurity region in a semiconductor film on an insulated surface; forming an insulating film to be in contact with the semiconductor film; forming an opening portion in the insulating film so as to expose the impurity region; forming a conductive film functioning as a source or drain electrode and a lower electrode electrically connected to the impurity region at the opening portion; forming an insulator on the conductive film; and forming an upper electrode on the insulator, wherein surface modification is carried out to the conductive film by a sputtering method.

As described above, since the insulator is formed in extremely thin, adhesiveness of the insulator can be improved by carrying out the surface modification.

An another mode of a method for manufacturing a memory device of the present invention is characterized by forming an impurity region in a semiconductor film on an insulated surface; forming an insulating film to be in contact with the semiconductor film; forming an opening portion so as to expose the impurity region at the insulating film; forming a conductive film functioning as a source or drain electrode and a lower electrode electrically connected to the impurity region at the opening portion; forming an insulator on the conductive film; and forming an upper electrode on the insulator, wherein after modification is carried out only to an upper surface of the conductive film provided at the periphery of the opening portion, the insulator is formed by a droplet discharging method.

By the present invention, an electrode for a memory is not necessary, and thus the number of manufacturing steps is reduced, and a memory element and a memory circuit having the element with lowered cost are provided.

BRIEF DESCRIPTION OF THE DRAWINGS

In the accompanying drawings:

FIGS. 1A to 1D are views showing manufacturing steps of a memory element;

FIGS. 6A and 6B are views showing manufacturing steps of a memory element;

DETAILED DESCRIPTION OF THE INVENTION

Figure 2A:
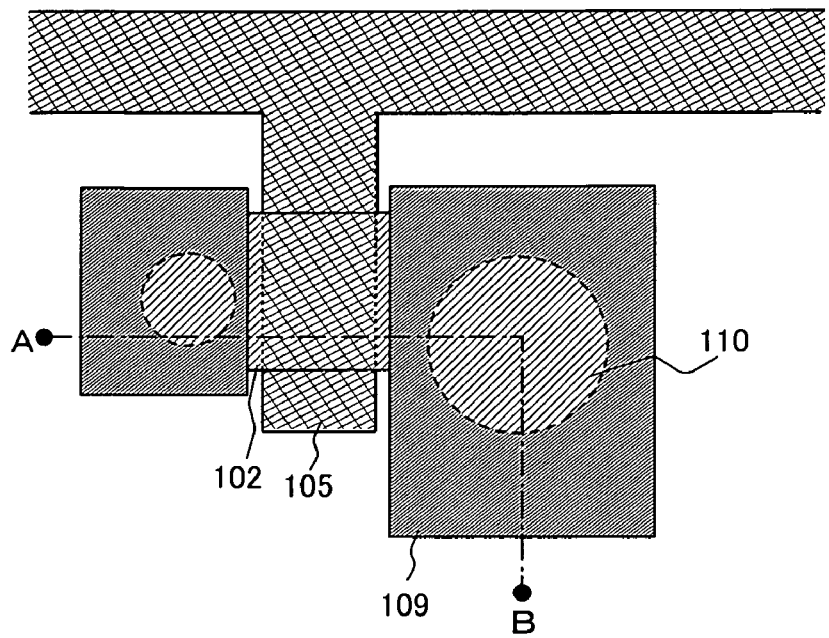
FIGS. 2A and 2B are top views showing manufacturing steps of a memory element.

Hereinafter, embodiment modes of the present invention will be described based on the accompanying drawings. However, the present invention can be carried out in many different modes, and it is easily understood by those skilled in the art that modes and details herein disclosed can be modified in various ways without departing from the spirit and the scope of the present invention. Therefore, the present invention should not be interpreted as being limited to the description of the embodiment modes to be given below. Note that in all drawings for describing the embodiment modes, the same reference numerals are used for the same portions or the portions having similar functions, and the repeated description thereof is omitted.

Embodiment Mode 1

In this embodiment mode, a manufacturing process of a memory element will be described.

As shown in FIG. 1A, a base film 101 is formed on a substrate 100 having an insulated surface. For the substrate 100, a glass substrate such as a barium borosilicate glass and an alumino borosilicate glass; a quartz substrate; a stainless steel (SUS) substrate; and the like can be used, for example. In addition, a substrate formed from a plastic typified by PET (polyethylene terephthalate), PEN (polyethylene naphthalate), PES (polyether sulfone), or a synthetic resin having flexibility such as acrylic, generally has a low heat resistance as compared with other substrates; however it can be used as long as it can withstand a processing temperature in manufacturing steps.

The base film 101 is provided to prevent an alkali metal such as Na, or an alkaline earth metal included in the substrate 100 from diffusing in a semiconductor film and adversely affecting characteristics of a semiconductor element. Therefore, the base film is formed using an insulating film such as silicon oxide, silicon nitride or silicon nitride oxide, which can suppress the diffusion of the alkali metal or the alkaline earth metal into the semiconductor film.

In a case of using a substrate in which an alkali metal or an alkaline earth metal is included in any way, such as a glass substrate, a stainless steel substrate or a plastic substrate, providing a base film is effective for prevention of the diffusion of an impurity. On the other hand, in a case that the impurity diffusion is not a big problem, like a quartz substrate, the base film is not necessarily provided.

Next, an amorphous semiconductor film is formed on the base film 101. Silicon germanium as well as silicon can be used for the amorphous semiconductor film. In a case of using silicon germanium, the concentration of germanium is preferably approximately 0.01 to 4.5 atomic %. In this embodiment mode, a semiconductor film mainly containing silicon of 66 nm (also referred to as an amorphous silicon film or amorphous silicon) is used.

Then, the amorphous semiconductor film is crystallized to form a crystalline semiconductor film. As a method for crystallization, a heating furnace, laser irradiation, or light irradiation emitted from a lamp (lamp annealing) or a method which is a combination of the foregoing methods, can be used.

For example, the crystalline semiconductor film is formed by adding a metal element to the amorphous semiconductor film and conducting a heat treatment using a heating furnace. In this manner, by adding the metal element, crystallization can be performed at low temperature, which is preferable. Addition here indicates that a metal element is formed on the surface of the amorphous semiconductor film at least so as to promote crystallization of the amorphous semiconductor film. For example, Ni solution (including water solution and acetic acid solution) is applied on the amorphous semiconductor film by an application method such as a spin coating method or a dipping method, and that a film containing Ni (however, there is a case that it cannot be observed as a film because it is extremely thin) is formed. At this time, wettability of the surface of the amorphous semiconductor film is preferably improved in order to spread the solution over the entire surface of the amorphous semiconductor film. For example, an oxide film is formed to have a thickness of 1 to 5 nm by UV light irradiation in oxygen atmosphere, a thermal oxidation method, a treatment with ozone water including hydroxy radical or hydrogen peroxide, or the like, and therefore the wettability can be improved.

Thereafter, the amorphous semiconductor film is heated at 500 to 550° C. for 2 to 20 hours, and the amorphous semiconductor film is crystallized; therefore a crystalline semiconductor film is formed. At this time, it is preferable that heating temperature be gradually changed. In addition, hydrogen or the like in the amorphous semiconductor film comes out by a low temperature heating step, and therefore roughness of the film at the time of the crystallization is decreased, a so-called dehydrogenation can be carried out. For example, after the amorphous semiconductor film is heated at 500° C. for 1 hour using a vertical furnace, crystallization can be carried out by a heat treatment at 550° C. for 4 hours.

In a case of carrying out the crystallization using the metal element in this manner, a gettering step is performed in order to reduce or remove the metal element. For example, the amorphous semiconductor film is formed as a gettering sink and is heated; therefore the metal element can be captured.

Thereafter, a heat treatment is conducted under nitrogen atmosphere at 550° C. for 4 hours, and the metal element is reduced or removed. Then, the amorphous semiconductor film which has become a gettering sink, and the oxide film are removed by hydrofluoric acid or the like, and therefore a crystalline semiconductor film in which the metal element is reduced or removed, can be obtained.

The amorphous semiconductor film is irradiated with a laser light (laser beam) as another crystallization method. One or more from an Ar laser, a Kr laser, an excimer laser, a YAG laser, a $Y_2O_3$ laser, a $YVO_4$ laser, a YLE laser, a $YAlO_3$ laser, a glass laser, a ruby laser, an alexandrite laser, a Ti:sapphire laser, a copper vapor laser and a gold vapor laser, can be used. A laser oscillation has a continuous oscillation type (also referred to as a CW laser) and a pulsed oscillation type (also referred to as a pulsed laser), and these can be used. Furthermore, a fundamental wave of laser or the second to the fourth harmonic of the fundamental wave individually or a combination of thereof, can be used.

The shape of laser beam is preferably linear. Accordingly, throughput can be improved. Further, a semiconductor film is preferably irradiated with a laser light having an incidence angle θ (0°<θ<90°). It is because that an interference of the laser can be prevented.

The crystalline semiconductor film formed in this manner is processed (or patterned) into a predetermined shape as shown in FIG. 1A to form an island shaped semiconductor film 102. At a time of patterning, a photo resist is applied on the crystalline semiconductor film and a predetermined mask shape is exposed to form a mask. By using this mask, the crystalline semiconductor film can be patterned by a dry etching method.

Thereafter, a gate insulating film 104 is formed so as to cover the semiconductor film 102. The gate insulating film 104 may be a single layer or a stacked layer. An insulating material which becomes the gate insulating film 104 may be an inorganic material or an organic material. For example, silicon oxide, silicon nitride and silicon oxynitride can be used. Note that the surface of the island shaped semiconductor film is preferably washed with hydrofluoric acid or the like before forming the gate insulating film 104. It is because that interface contamination of the semiconductor film and the gate insulating film adversely affects an electric characteristic of a thin film transistor. Therefore, the semiconductor film and the gate insulating film may be formed continuously without being exposed to atmospheric air, and then the semiconductor film and the gate insulating film may be patterned into predetermined shapes concurrently.

A conductive film which becomes a gate electrode 105 is formed on the semiconductor film 102 through the gate insulating film 104. The gate electrode 105 may be a single layer or a stacked layer. The edge of the gate electrode 105 may be taper shaped. As the conductive film which becomes the gate electrode 105, an element selected from Ta, W, Ti, Mo, Al or Cu; an alloy material or a compound material mainly containing the foregoing element, can be used.

An impurity region 103 is formed using the gate electrode 105 as a mask in a self alignment manner. In a case of forming an n-type thin film transistor, phosphine ($PH_3$) is added, and then an impurity region in which phosphorus (P) is added is formed. In a case of forming a p-type thin film transistor, diborane ($B_2H_6$) is added, and then an impurity region in which boron (B) is added, is formed.

The impurity region 103 is classified into a high concentration impurity region and a low concentration impurity region, in accordance with impurity concentration. For example, in a taper portion of the gate electrode 105, there is less amount of addition of an impurity element; therefore a low concentration impurity region is formed and a high concentration impurity region can be formed in a region where the gate electrode 105 is not formed. A structure in which a gate electrode and a part of the impurity region are overlapped, is called a GOLD (Gate Overlapped Drain) structure.

In addition, a structure in which an insulator is provided at the side of the gate electrode 105, a so-called offset structure, can also be used. In the offset structure, a distance between a channel formation region and the impurity region 103 can be set in accordance with the width of the insulator.

A first insulating film 106 is formed so as to cover the gate insulating film 104 and the gate electrode 105. The first insulating film can be formed from any of silicon oxide, silicon nitride or silicon oxynitride. Specifically, it is preferable that the first insulating film be an insulating film containing hydrogen; therefore the first insulating film is preferably formed by a CVD method.

Thereafter, a heat treatment is preferably conducted in order to activate the impurity region 103. The heat treatment is conducted under nitrogen atmosphere at 400 to 550° C. using a heating furnace, for example. Accordingly, a dangling bond and the like of the semiconductor film 102 can be reduced by hydrogen from the first insulating film 106.

Then, as shown in FIG. 1B, a second insulating film 108 is formed so as to cover the first insulating film 106. The flatness can be enhanced by the second insulating film 108. The second insulating film 108 can be formed using an organic material or an inorganic material. As the organic material, polyimide; acrylic; polyamide; polyimide amide; resist; benzocyclobutene; siloxane; or polysilazane can be used. Siloxane has a skeleton structure formed by a bond of silicon (Si) and oxygen (O). As a substituent, an organic group containing at least hydrogen (for example, an alkyl group and aromatic hydrocarbon) is used. A fluoro group may also be used as a substituent. In addition, an organic group containing at least hydrogen and a fluoro group may be used as a substituent. Polysilazane is formed by a liquid material including a polymer material having a bond of silicon (Si) and nitrogen (N) as a starting material. As the inorganic material, silicon oxide; silicon nitride; silicon oxynitride; or the like can be used. In addition, the second insulating film 108 may have a single layer structure or a stacked layer structure. Specifically when the second insulating film is formed using an organic material, the flatness is enhanced, whereas moisture or oxygen is absorbed by the organic material. In order to prevent this, the second insulating film may have a stacked layer structure in which an inorganic material is formed on an organic material.

Thereafter, an opening potion, a so-called contact hole 110, is formed in the gate insulating film 104, the first insulating film 106, and the second insulating film 108. The contact hole 110 can be formed by a dry etching method or a wet etching method. An etchant which can have a selection ratio between the gate insulating film 104, the first insulating film 106, and the second insulating film 108 and the semiconductor film 102 at the time of forming the contact hole 110, is preferable as the etchant used for such etching methods. At this time, the edge of the second insulating film 108 around the contact hole 110 may be rounded off. Accordingly, disconnection of a conductive film which is subsequently formed can be prevented.

Note that a memory element is formed using interior of the contact hole 110 in the present invention, and therefore the diameter, the depth, the taper angle and the like of the contact hole 110 are determined. For example, the contact hole 110 at the side where the memory element is formed, is set to have a larger diameter as compared with the contact hole at the side where the memory element is not formed. For example, the diameter is set to be 1 to 3 μm.

Thereafter, a conductive film which becomes an electrode 109 is formed in the contact hole 110. The electrode 109 can have a single layer structure or a stacked layer structure. The conductive film may be formed from an element of aluminum (Al); titanium (Ti); molybdenum (Mo); tungsten (W); or silicon (Si); or an alloy containing these elements. Also, a light-transmitting material such as indium tin oxide (ITO), indium tin oxide containing silicon oxide, or indium oxide containing zinc oxide of 2 to 20% can be used as the conductive film. Such the conductive film is formed by a sputtering method, a droplet discharging method or the like, and is patterned into a predetermined shape; therefore the electrode 109 is formed. Note that in an aspect of the present invention, the electrode 109 connected to the impurity region 103 functions as a source or drain electrode, and also functions as a lower electrode of the memory element. In the present invention, it is not necessary to newly form a conductive film as the lower electrode; therefore the number of steps can be reduced and cost can be reduced.

The steps up to this point are shown by a top view in FIG. 2A. As is clear from FIG. 2A, in order to keep the diameter of the contact hole 110 at the side where the memory element is formed large, the semiconductor film 102 may be patterned into an oblong shape. In addition, as shown in FIG. 2A, by patterning the conductive film, a wiring connected to the electrode is formed at the same time. For example, a word line is formed at the same time as the gate electrode 105. A selection signal is inputted to the word line from a control circuit. In addition, a signal line is formed at the same time as the source electrode and the drain electrode.

The source electrode and the drain electrode are formed in this manner, and then a thin film transistor 107 can be completed.

As shown in FIG. 1C, an insulator 112 constituting a memory element is formed inside the contact hole 110. The insulator 112 may have a thickness of 5 to 100 nm, preferably 10 to 60 nm.

The insulator 112 can be formed from an inorganic material or an organic material. Also, the insulator 112 can be formed from these materials by an evaporation method, a spin coating method, a droplet discharging method or the like. The insulator 112 may be formed from a material whose property is changed by an optical effect, a thermal effect or the like. For example, a material, whose property is changed by fusion by Joule heat, dielectric breakdown or the like and which can short-circuit the electrode 109 functioning as a lower electrode and an upper electrode formed thereafter, is preferable.

As the inorganic material, silicon oxide, silicon nitride, silicon oxynitride and the like are given. Dielectric breakdown is generated in such inorganic materials by controlling the film thickness; therefore a lower electrode and an upper electrode can be short-circuited to each other.

As the organic material, for example an aromatic amine based (in other words, including benzene ring-nitrogen bond) compound such as 4,4'-bis[N-(1-naphthyl)-N-phenylamino] biphenyl (abbreviation: α-NPD), 4,4'-bis[N-(3-methylphenyl)-N-phenylamino]biphenyl (abbreviation: TPD), 4,4'4"-tris(N,N-diphenylamino)triphenylamine (abbreviation: TDATA), 4,4'4"-tris[N-(3-methylphenyl)-N-phenylamino] triphenylamine (abbreviation: MTDATA), and 4,4'-bis[N-{4-(N,N-di-m-tolylamino)phenyl}-N-phenylamino]biphenyl (abbreviation: DNTPD); polyvinylcarbazole (abbreviation: PVK); a phthalocyanine compound such as phthalocyanine (abbreviation: $H_2Pc$), copper phthalocyanine (abbreviation: CuPc) and vanadyl phthalocyanine (abbreviation: VOPc) can be used. These materials have high hole transporting properties.

In addition, as the organic compound material, for example a material formed from a metal complex or the like having a quinoline skeleton or a benzoquinoline skeleton, such as tris (8-quinolinolato)aluminum (abbreviation: $Alq_3$), tris(4-methyl-8-quinolinolato)aluminum (abbreviation: $Almq_3$), bis (10-hydroxybenzo[h]quinolinato)beryllium (abbreviation: $BeBq_2$), bis(2-methyl-8-quinolinolato)(4-phenylphenolato) aluminum (abbreviation: BAlq), or a metal complex having a oxazole-based ligand or a thiazole-based ligand, such as bis [2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$), can also be used. These materials have high electron transporting properties.

In order to change the properties of such organic materials by a thermal effect and the like, the glass-transition temperature (Tg) may be 80 to 300° C., preferably 100 to 250° C.

Furthermore, in addition to the metal complex, a compound such as 2-(4-biphenylyl)-5-(4-tert-butylphenyl)-1,3,4-oxadiazole (abbreviation: PBD); 1,3-bis[5-(p-tert-buthylphenyl)-1,3,4-oxadiazole-2-yl]benzene (abbreviation: OXD-7); 3-(4-tert-buthylphenyl)-4-phenyl-5-(4-biphenylyl)-1,2,4-triazole (abbreviation: TAZ); 3-(4-tert-buthylphenyl)-4-(4-ethylphenyl)-5-(4-biphenylyl)1,2,4-triazole (abbreviation: p-EtTAZ); or bathophenanthroline (abbreviation: BPhen); or bathocuproin (abbreviation: BCP) can be used.

As one feature of a single layer structure or a stacked layer structure with the above materials, a light-emitting material such as 4-dicyanomethylene-2-methyl-6-[2-(1,1,7,7-tetramethyljulolidine-9-yl)ethenyl]-4H-pyran (abbreviation: DCJT); 4-dicianomethylene-2-t-buthyl-6-[2-(1,1,7,7-tetramethyljulolidine-9-yl)ethenyl]-4H-pyran; periflanthene; 2,5-dicyano-1,4-bis[2-(10-methoxy-1,1,7,7-tetramethyljulolidine-9-yl)ethenyl]benzene; N,N'-dimethylquinacridon (abbreviation: DMQd); coumarin 6; coumarin 545T; tris(8-quinolinolato)aluminum (abbreviation: $Alq_3$); 9,9'-bianthryl; 9,10-diphenylanthracene (abbreviation: DPA); 9,10-bis(2-naphthyl)anthracene (abbreviation: DNA); or 2,5,8,11-tetra-(tert-buthyl)perylene (abbreviation: TBP) can be used.

In a case of forming layer in which the above light-emitting material is dispersed, as a material which becomes a mother body, anthracene derivatives such as 9,10-di(2-naphthyl)-2-tert-buthylanthracene (abbreviation: t-BuDNA); carbazole derivatives such as 4,4-bis(N-carbazolyl)biphenyl (abbreviation: CBP); or a metal complex such as bis[2-(2-hydroxyphenyl)pyridinato]zinc (abbreviation: $Znpp_2$) or bis[2-(2-hydroxyphenyl)benzoxazolato]zinc (abbreviation: ZnBOX) can be used. In addition, tris(8-quinolinolato)aluminum (abbreviation: $Alq_3$); 9,10-bis(2-naphthyl)anthracene (abbreviation: DNA); bis(2-methyl-8-quinolinolato)(4-phenylphenolato)aluminum (abbreviation: BAlq); or the like can be used.

In addition, a material in which metal oxide is mixed with the above organic materials and light-emitting materials may also be used. Note that the mixed material includes a state in which materials are mixed or a state in which the materials are stacked. Specifically, it indicates a state which is formed by a co-evaporation method using multiple evaporation sources.

In a case of mixing a substance having a high hole transporting property with a metal oxide, a vanadium oxide, a molybdenum oxide, a niobium oxide, a rhenium oxide, a tungsten oxide, a ruthenium oxide, a titanium oxide, a chromium oxide, a zirconium oxide, a hafnium oxide, and tantalum oxide can be used as the metal oxide.

In a case of mixing a substance having a high electron transporting property with a metal oxide, a lithium oxide, a calcium oxide, a sodium oxide, a kalium oxide and a magnesium oxide can be used as the metal oxide.

Also, as the insulator 112, a material whose property is changed by an optical effect or a thermal effect, may be used; therefore a conjugated polymer in which a compound (photoacid generator) generating acidum by absorbing light is added, can also be used. As the conjugated polymer, polyacetylene group, polyphenylenevinylene group, polythiophene group, polyaniline group, polyphenyleneetylene group, and the like can be used. In addition, as the photoacid generator, arylsulfonium salt, aryliodonium salt, o-nitrobenzyltosylate, arylsulfonic acid, p-nitrobenzylester, sulfonylacetophenone group, Fe-arene complex $PF_6$ salt, and the like can be used.

Figure 2B:
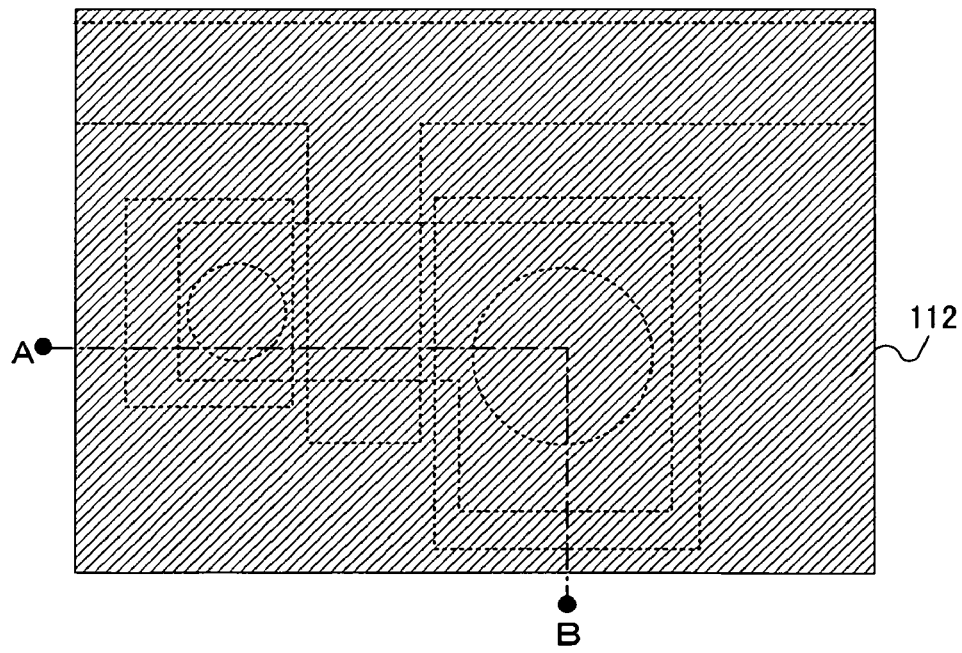

A top view of a state in which the insulator 112 is formed, is shown in FIG. 2B. As shown in FIG. 2B, the insulator 112 can be formed overall, however the insulator 112 can be formed selectively so as to cover the lower electrode, in the contact hole 110 region. In an aspect of the present invention, a memory element is formed inside the contact hole 110 region, and it can function as the memory element as long as the lower electrode and an upper electrode are not short-circuited to each other.

In addition, in this embodiment mode, the description is given focusing on one contact hole 110 region, however the memory element can be formed using the other contact hole.

Then, a conductive film which becomes an upper electrode 113 is formed covering the insulator 112. The conductive film can be formed in the same manner as the electrode 109, however the conductive film is not necessarily formed using the same materials and the same steps. The upper electrode 113 is electrically connected to a control circuit, and writing operation or reading operation of the memory element can be performed by the control circuit, in accordance with a change in a state of the insulator 112. Specifically, the memory element can have a state in which the lower electrode and the upper electrode are not short-circuited (referred to as an initial state), and a state in which the lower electrode and the upper electrode are short-circuited (referred to as a short-circuited state). By this difference in the state, the memory element can have information of "0" or "1". In the short-circuited state, the lower electrode and the upper electrode can be short-circuited at the side surface or the top surface of the contact hole, in addition to that the upper electrode and the lower electrode are short-circuited at the bottom surface of the contact hole.

The thickness of the insulator at the side surface of the contact hole or a boundary region between the side surface and the top surface often becomes thin at a time of forming a film. Therefore, the upper electrode and the lower electrode can be easily short-circuited to each other.

Figure 15:
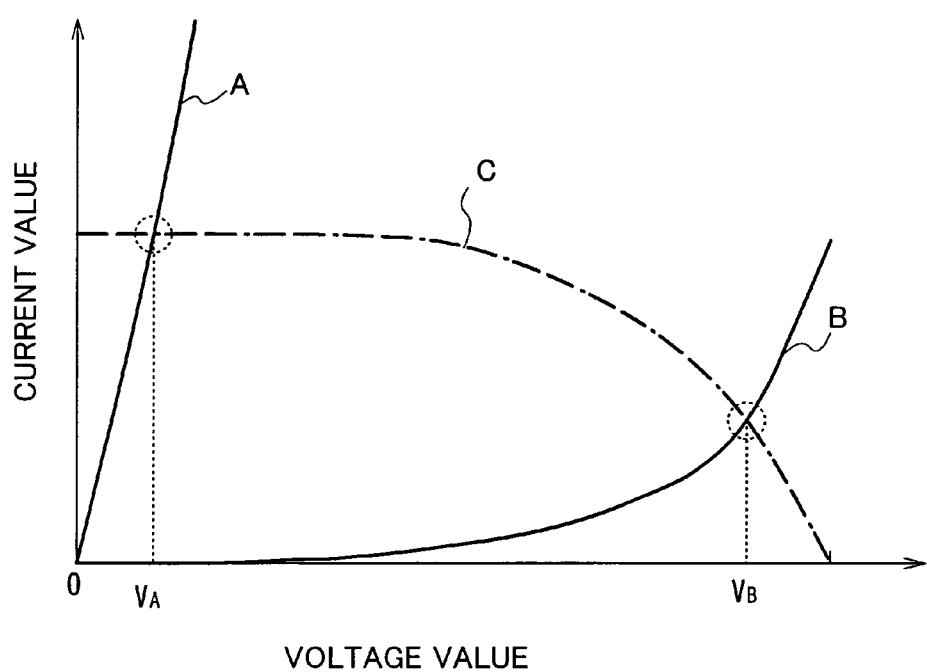
FIG. 15 is a view showing an I-V characteristic of a memory element.

FIG. 15 shows a voltage-current characteristic of a memory element. In the initial state A, current does not flow in a memory element when certain voltage ($V_B$) or more is not applied. On the other hand, in the short-circuited state B, current flows in a memory element when even a little voltage ($V_A$: $V_B < V_A$) is applied. Information of "0" or "1" can be provided in accordance with the difference in a voltage value. Note that voltage $V_A$ is a voltage value at the intersecting point of the voltage-current characteristic C of the thin film transistor 107 and the initial state A. Also, voltage $V_B$ is a voltage value at the intersecting point of the voltage-current characteristic C of the thin film transistor 107 and the short-circuited state B. The voltage value is read by the control circuit; therefore information of "0" or "1" can be provided. These operations will be described in detail in following embodiment modes.

Thereafter, a passivation film 115 is preferably formed as shown in FIG. 1D. The passivation film 115 can have a single layer structure or a stacked layer structure, and an inorganic material is preferably used. Especially, the passivation film 115 is preferably formed using silicon nitride or silicon oxynitride. It is because that an insulating film containing nitrogen has an effect to prevent an alkali metal from entering.

In order to short-circuit the lower electrode and the upper electrode, the thin film transistor 107 is turned on in accordance with the selection signal inputted from the word line, current flows between the source electrode and the drain electrode, and then the property of the insulator 112 is changed by the current flowing. For example, the property, in other words the state, of the insulator 112 is changed by Joule heat generated by the current flowing. In addition, dielectric breakdown is generated in the insulator 112 and the state is changed by the current flowing. The lower electrode and the upper electrode can be short-circuited by using such the change in the state.

As described above, the memory element controlled by the thin film transistor 107 can be formed. The memory element is formed inside the contact hole and the source or drain electrode functions as the lower electrode of the memory element in the present invention; therefore the number of steps can be reduced and cost can be reduced.

Figure 16A:
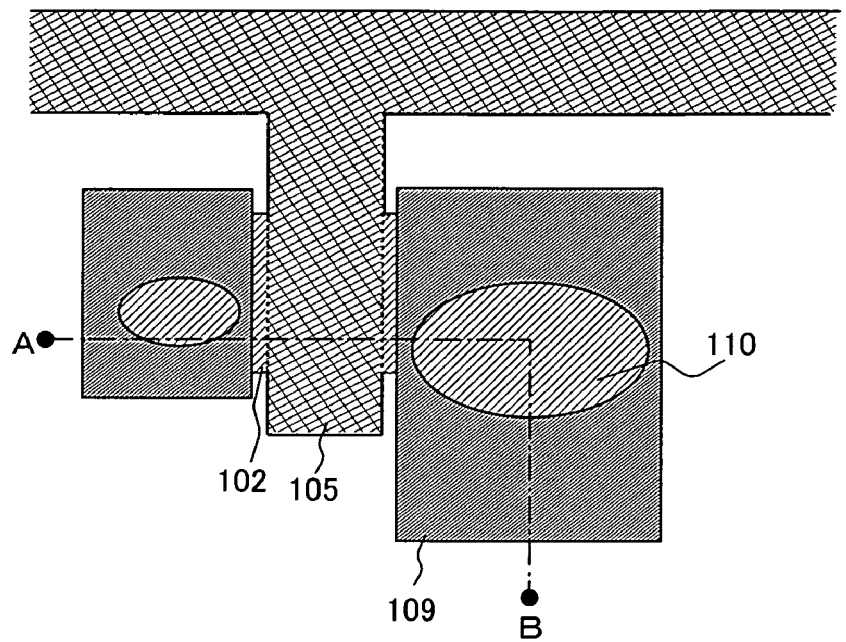
FIGS. 16A and 16B are top views showing a manufacturing step of a memory element.
Figure 16B:
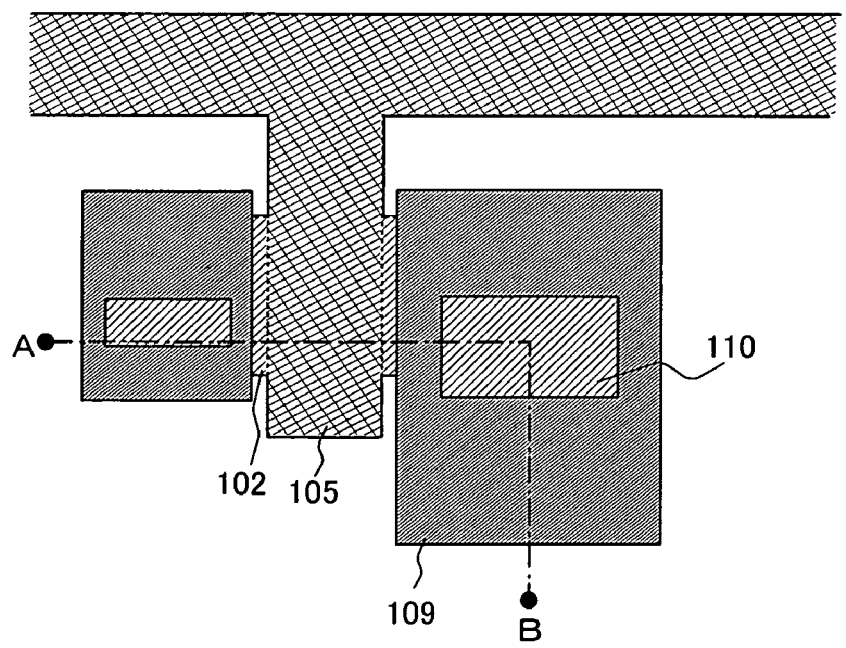

The case of using round shape as a contact hole has been described, however the shape is not limited to this, and an elliptical shape as shown in FIG. 16A and an oblong shape as shown in FIG. 16B may also be used.

Embodiment Mode 2

In this embodiment mode, a mode in which a plurality of memory elements are formed inside a contact hole, will be described.

Figure 3:
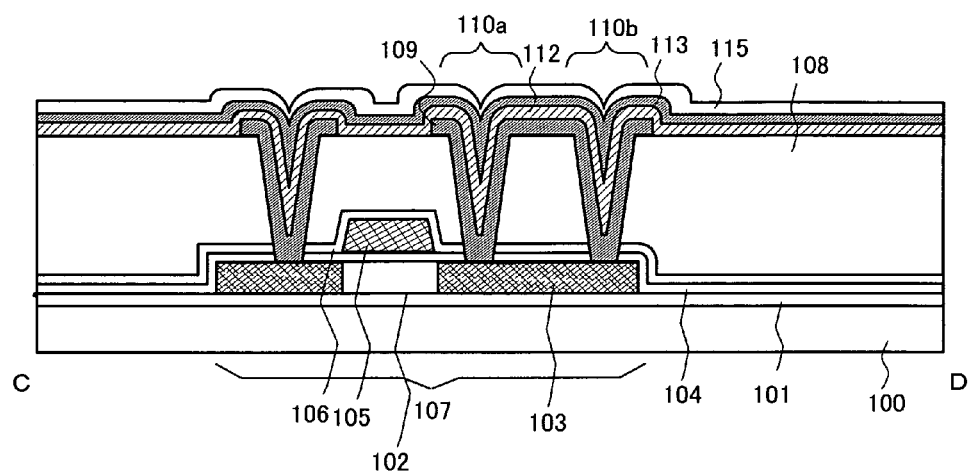
FIG. 3 is a view showing a manufacturing step of a memory element.

As shown in FIG. 3, contact holes 110a and 110b are formed in the second insulating film 108 in the same manner as Embodiment Mode 1. The contact holes 110a and 110b can be formed by a dry etching method or a wet etching method.

Figure 4:
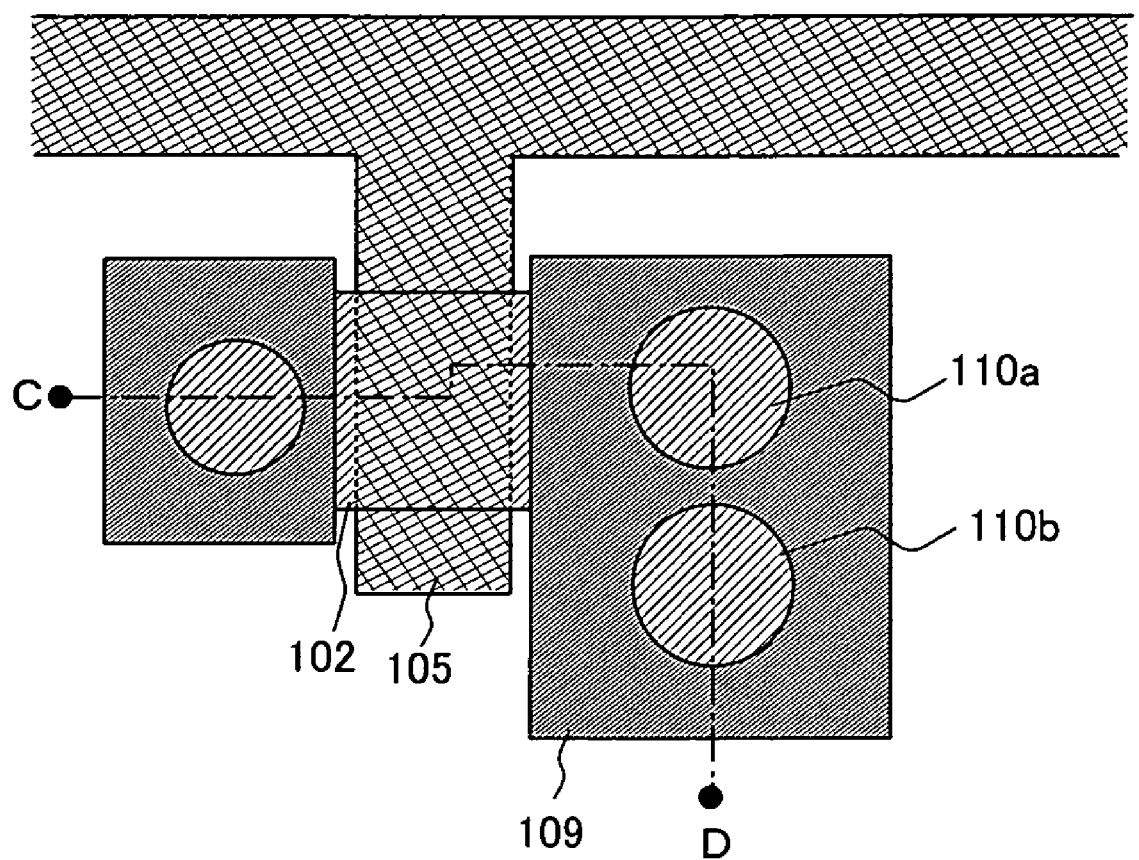
FIG. 4 is a top view showing a manufacturing step of a memory element.

A top view of this state is shown in FIG. 4. As shown in FIG. 3 and FIG. 4, the diameter, the depth, the taper angle and the like of the contact holes 110a are equal to the diameter, the depth, the taper angle and the like of the contact hole 110b in this embodiment mode, however it is not necessarily limited thereto. In other words, in an aspect of the present invention, a memory element is formed inside a contact hole and a source or drain electrode functions as a lower electrode of the memory element; therefore the shape or the number of the contact hole are not limited. The memory element is formed inside the contact hole and the source or drain electrode functions as the lower electrode of the memory element; therefore the number of steps can be reduced and cost can be reduced.

After that, an insulator 112, an upper electrode 113 and a passivation film 115 are formed in the same manner as Embodiment Mode 1.

Since the memory element is formed inside the contact hole and the source or drain electrode functions as the lower electrode of the memory element in the present invention; therefore the number of steps can be reduced and cost can be reduced.

Embodiment Mode 3

In this embodiment mode, a mode in which surface modification is carried out to a formation surface before forming an insulator 112, will be described.

Figure 5A:
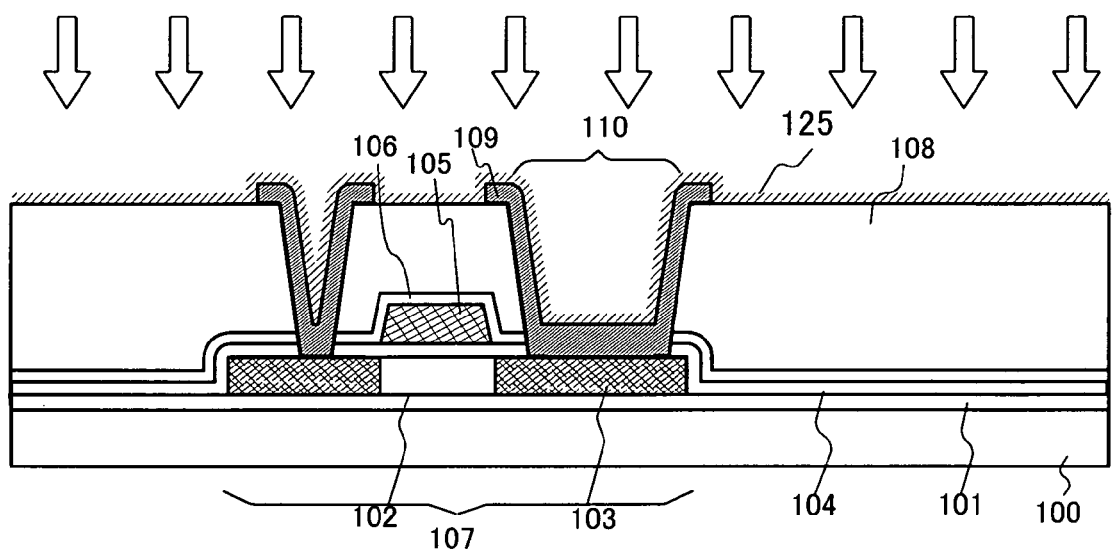
FIGS. 5A and 5B are views showing manufacturing steps of a memory element.

As shown in FIG. 5A, up to forming an electrode 109 is the same as Embodiment Mode 1. Then, the surface modification is carried out to the entire surface of the electrode 109 and the second insulating film 108. In order to perform the surface modification to the entire surface, a plasma treatment may be conducted in oxygen atmosphere. Accordingly, the state of the surface shown by 125 is improved (it is referred to as surface modification).

The thickness of an insulator 112 is preferably thin in order to make it easy for a lower electrode and an upper electrode to be short-circuited to each other. For example, the insulator 112 is formed using an inorganic material, and the thickness of the insulator 112 may be 5 to 100 nm, preferably 10 to 60 nm. Therefore, when the insulator 112 is formed inside a contact hole 110 and the like, especially disconnection at the edge of the contact hole 110 is concerned. By conducting an oxygen plasma treatment to the formation surface of the insulator 112 like this embodiment mode, adhesiveness can be improved, and the disconnection is preferably prevented. Thus, it becomes easy to form the insulator 112 by carrying out the surface modification to the formation surface of the insulator 112, which is preferable.

As a means for carrying out such surface modification, a film having high adhesiveness with the insulator 112 and the electrode 109 may be formed, in addition to the oxygen plasma treatment. It is because that a means to improve the adhesiveness of the insulator 112 can have an effect to prevent the disconnection of the insulator 112.

In order to prevent the disconnection, it is preferable that the insulator 112 be formed by an evaporation method. It is because that accuracy of film formation to the side surface of the contact hole 110 is high when the insulator 112 is formed by an evaporation method as compared with a spin coating method.

Figure 5B:
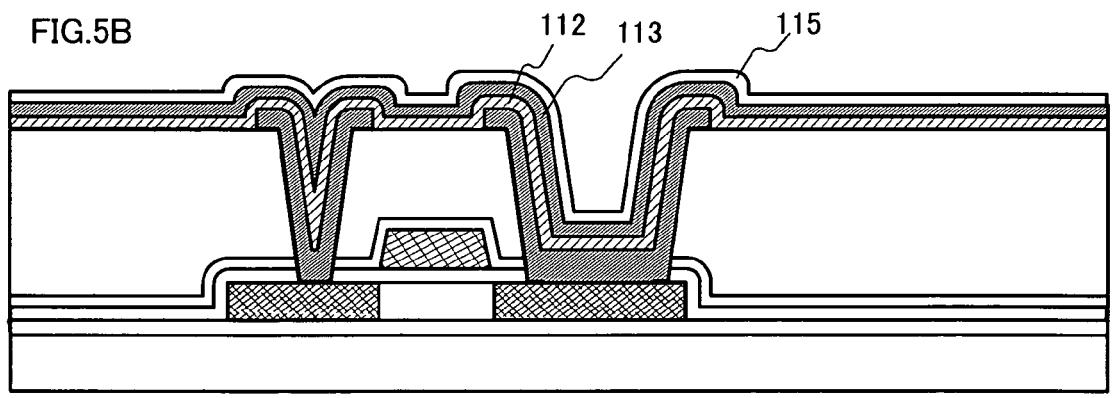

After that, as shown in FIG. 5B, an upper electrode 113 and a passivation film 115 are formed in the same manner as Embodiment Mode 1.

The memory element is formed inside the contact hole and the source or drain electrode functions as the lower electrode of the memory element in the present invention; therefore the number of steps can be reduced and cost can be reduced.

Embodiment Mode 4

In this embodiment mode, a mode in which a surface modification is selectively carried out before forming an insulator 112, which is different from the above embodiment modes, will be described.

As shown in FIG. 6A, a surface modification is carried out at least to a surface of an electrode 109. For example, a conductive film which becomes the electrode 109 is formed, and the surface modification is carried out by scratching a surface of the conductive film by a sputtering method. For example, an element substrate over which the conductive film is formed, is placed in a film formation chamber, and a treatment is carried out at the condition that the surface of the conductive film is scratched. For example, the treatment having pressure of 0.6 Pa (0.6/133 Torr) to 1.0 Pa (1/133 Torr) and power of 200 to 400 W is conducted for 3 to 15 minutes. Thereafter, the conductive film is patterned into a predetermined shape; therefore an electrode 109 having a surface 126 only to which the surface modification is carried out, can be formed. As described above, an adhesiveness of the insulator 112 can be held by the electrode 109 having the modified surface.

In this embodiment mode, since it is acceptable as long as the insulator 112 is formed inside the contact hole 110 without disconnection, only a selective surface modification is necessary for the formation surface of the insulator 112. In addition, it is preferable that the insulator 112 be formed by an evaporation method in order to prevent the disconnection. It is because that accuracy of film formation to the side surface of the contact hole 110 is high when the insulator 112 is formed by an evaporation method as compared with a spin coating method.

In addition to scratching the formation surface of the insulator 112 using a sputtering method, the conductive film may be formed at the condition that the conductive film has roughness of its surface, asperity is formed on the formation surface of the conductive film and the conductive film may be formed so as to follow the asperity, and a scratch may be put physically using a dry etching method, a frost processing method, a sandblast method or the like. In a case of forming the conductive film by a sputtering method, the process can be simplified by also conducting a sputtering treatment to scratch the formation surface in the same film formation chamber.

After that, as shown in FIG. 6B, an upper electrode 113 and a passivation film 115 are formed in the same manner as Embodiment Mode 1.

Since the memory element is formed inside the contact hole and the source or drain electrode functions as the lower electrode of the memory element in the present invention; therefore the number of steps can be reduced and cost can be reduced.

Embodiment Mode 5

In this embodiment mode, a mode in which an insulator 112 is formed by a droplet discharging method, will be described.

Figure 7A:
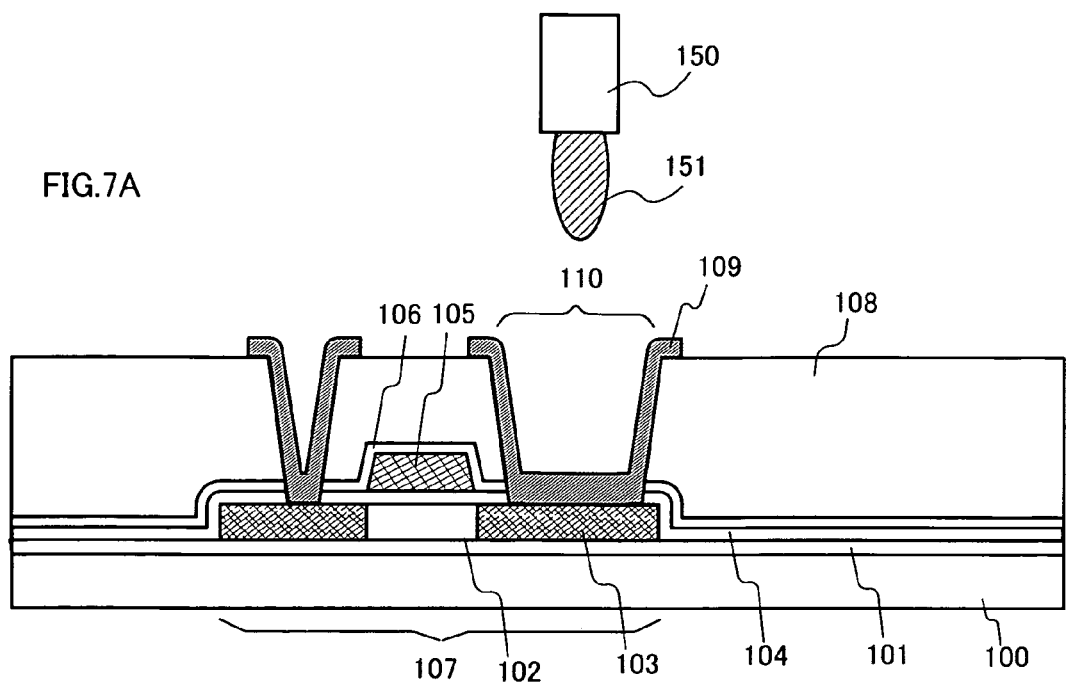
FIGS. 7A to 7C are views showing manufacturing steps of a memory element.

As shown in FIG. 7A, an electrode 109 is formed inside a contact hole 110 in the same manner as Embodiment Mode 1. Then, a droplet (dot) having a material for the insulator 112 is dropped inside the contact hole 110 from a predetermined nozzle 150. Such the droplet discharging method is also called an ink jetting method. The droplet 151 may be only a material for the insulator 112 or may be a solvent in which the material is dispersed.

Note that a surface modification may be carried out to a formation surface of the insulator 112 before forming the insulator 112 as shown in Embodiment Mode 3 or 4.

Figure 7B:
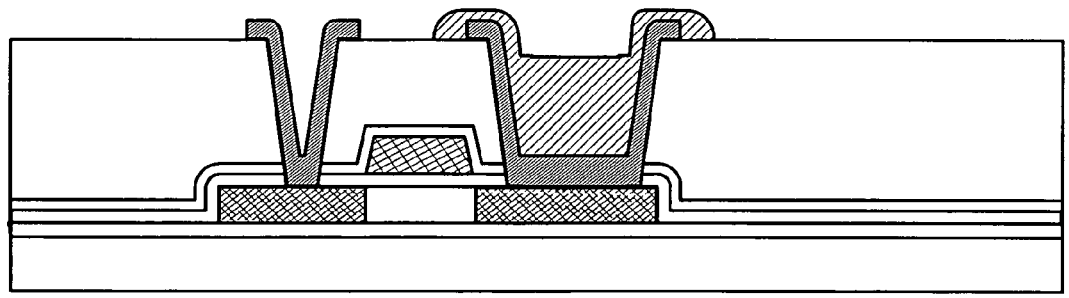

Thereafter, the insulator 112 is formed inside the contact hole 110 as shown in FIG. 7B. At this time, the insulator 112 is formed so that the electrode 109 and an upper electrode which is formed afterward are not short-circuited inside the contact hole 110. Therefore, it is not necessary that the contact hole 110 is filled with the insulator 112. In addition, by using surface tension, the insulator 112 can be thinly formed at the edge of the electrode 109. Accordingly, the edge of the electrode 109 and an upper electrode can be easily short-circuited.

Wettability with respect to the droplet 151 may be decreased at the periphery of the edge of the electrode 109. Accordingly, the droplet 151 can be selectively dropped on the electrode 109. As such a method for decreasing the wettability, a silane coupling agent may be selectively applied. As the silane coupling agent, a fluorine-based silane coupling agent (fuloroalkyl silane (FAS)) having a fluoroarkyl group is used. As a representative FAS, fluoroalkyl silane such as heptadecafluoro tetrahydrodecyl triethoxysilane, heptadecafluoro tetrahydrodecyl trichlorosilane, tridecafluoro tetrahydrooctyl trichlorosilane, or trifluoropropyl trimethoxysilane can be given.

It is preferable that the insulator 112 formed by a droplet discharging method be baked in some cases. Especially in a case that the droplet 151 includes solvent, the solvent may be removed by a heat treatment, and then the insulator 112 is baked.

Figure 7C:
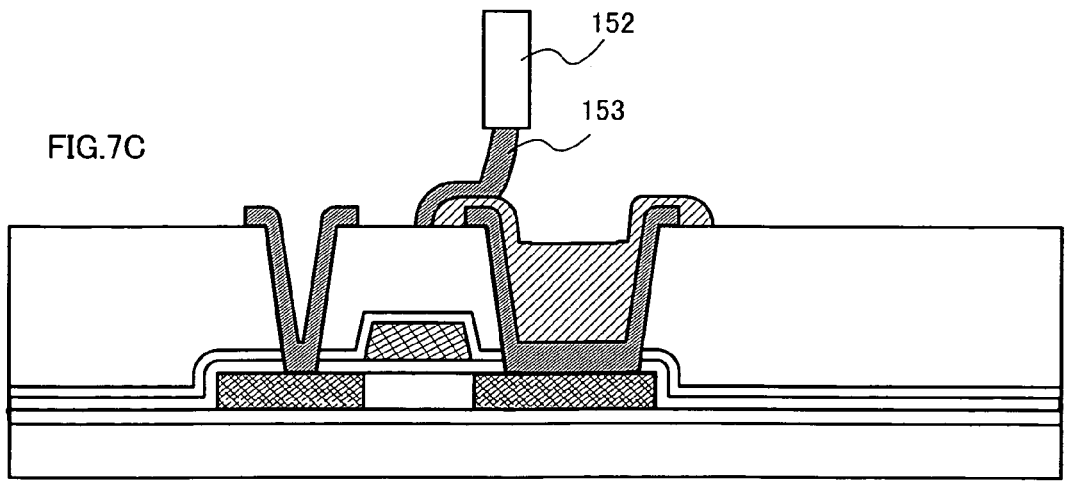

As shown in FIG. 7C, an upper electrode 113 is formed. A droplet (dot) 153 having a material for the upper electrode 113 is dropped by using a nozzle 152, and the upper electrode 113 is formed. In a case of forming the upper electrode 113 by a droplet discharging method, gold (Au); silver (Ag); copper (Cu); platinum (Pt); palladium (Pd); tungsten (W); nickel (Ni); tantalum (Ta); bismuth (Bi); lead (Pb); indium (In); tin (Sn); zinc (Zn); titanium (Ti); aluminum (Al); alloy including these elements; a dispersant nanoparticle of these elements; or a microparticle of silver halide is preferable, as the material.

In this embodiment mode, the upper electrode 113 is formed by a droplet discharging method, however the present invention is not limited to this, and a sputtering method or an evaporation method may also be used. In addition, the electrode 109 may be formed by a droplet discharging method.

It is preferable that the upper electrode 113 formed by a droplet discharging method be baked in some cases. Especially in a case that the droplet 153 includes solvent, the solvent may be removed, and then the upper electrode 113 may be baked.

As described above, by using a droplet discharging method, use efficiency of a material is increased, and it becomes possible that cost is reduced, manufacturing time is shortened, and the amount of a waste liquid treatment is reduced. Accordingly, manufacturing cost of the memory element can be reduced.

After that, a passivation film 115 is formed.

The memory element is formed inside the contact hole and the source or drain electrode functions as the lower electrode of the memory element in the present invention; therefore the number of steps can be reduced and cost can be reduced.

Embodiment Mode 6

In this embodiment mode, a mode of a contact hole structure which is different from the above embodiment modes, will be described.

Figure 8:
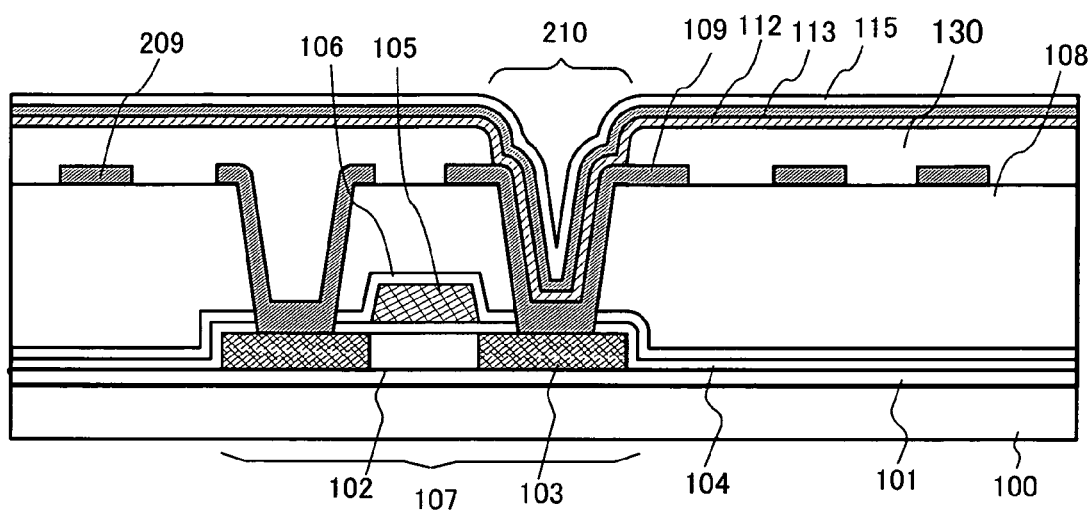
FIG. 8 is a view showing a manufacturing step of a memory element.

As shown in FIG. 8, a contact hole is formed and an electrode 109 is formed in the same manner as Embodiment Mode 1. At this time, a word line is formed as described above, however other wirings 209 can be formed. In order to increase added value of a memory element, a lot of wirings are required. In this case, forming a third insulating film 130 makes it possible to increase the degree of freedom in the layout and size of the wiring, the contact hole, the memory element, and the like. It is needless to say that the third insulating film 130 can be provided even in a case that the wiring 209 is not formed.

The third insulating film 130 can be formed using the similar material or method to the second insulating film 108 shown in Embodiment Mode 1.

Then, a contact hole 210 is formed in the third insulating film 130 according to the position of the contact hole formed in the second insulating film 108. Thereafter, an insulator 112, an upper electrode 113, and a passivation film 115 are formed inside the contact hole 210, and a memory element is completed in the same manner as Embodiment Mode 1. At this time, the edge of the third insulating film 130 around the contact hole 210 is preferably rounded off. It is because that the contact hole 210 is considered to be deeper as compared with the contact hole 110, and an effect to prevent disconnection of the insulator 112 or the upper electrode 113 can be expected.

This embodiment mode can be freely combined with the above embodiment modes. For example, surface modification may be carried out before forming the insulator 112, or the insulator 112, the upper electrode 113 and the like may be formed by a droplet discharging method.

The memory element is formed inside the contact hole and the source or drain electrode functions as the lower electrode of the memory element in the present invention; therefore the number of steps can be reduced and cost can be reduced.

Embodiment Mode 7

In this embodiment mode, a mode in which an amorphous semiconductor film is used for a thin film transistor, will be described.

Figure 9:
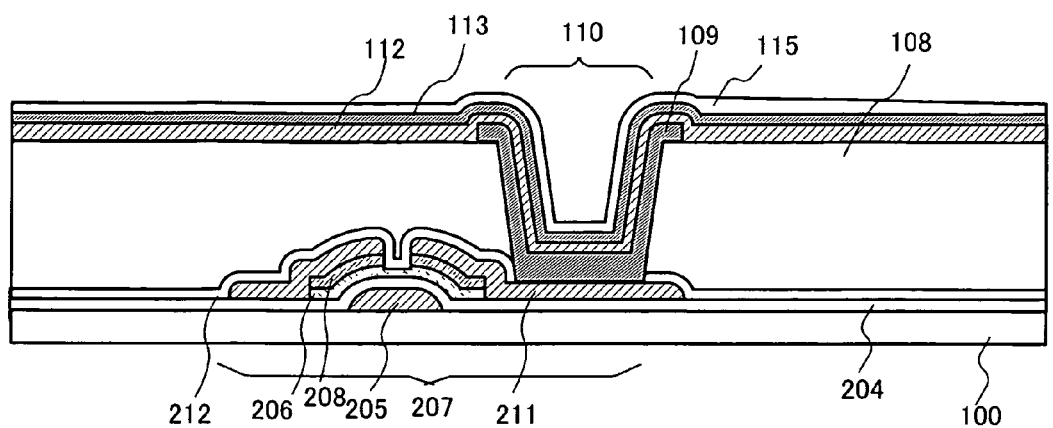
FIG. 9 is a view showing a manufacturing step of a memory element.

As shown in FIG. 9, a bottom gate type in which a gate electrode is provided on the lower side can be applied to a thin film transistor using an amorphous semiconductor film. A conductive film which becomes a gate electrode 205 is formed on a substrate 100 and is patterned into a predetermined shape. Thereafter, an insulating film which becomes a gate insulating film 204 is formed covering the gate electrode 205. Then, an amorphous semiconductor film 206 and an n-type semiconductor film 208 are formed sequentially, and are patterned into predetermined shapes. Then, a conductive film which becomes a source or drain electrode 211 is formed, and is patterned into a predetermined shape. The n-type semiconductor film 208 is etched using the source or drain electrode 211, and a part of the amorphous semiconductor film 206 is etched at the same time. Such the structure of the thin film transistor, in which a part of the amorphous semiconductor film is etched, can be called a channel etch type. In this way, a thin film transistor 207 having an amorphous semiconductor film can be formed.

Thereafter, a first insulating film 212 functioning as a protective film is preferably formed. In a channel etch structure, a part of the amorphous semiconductor film 206 is exposed, and therefore the first insulating film 212 may be provided to prevent an impurity element, moisture, or the like from entering. The first insulating film 212 achieving such the function may be formed using an insulating film having nitrogen, typically silicon nitride.

Then, a second insulating film 108 is formed and a contact hole 110 is formed in the same manner as Embodiment Mode 1. Then, an electrode 109 is formed inside the contact hole 110. In this embodiment mode, the electrode 109 functions as a lower electrode.

Thereafter, an insulator 112, an upper electrode 113, and a passivation film 115 are formed in the same manner as Embodiment Mode 1.

This embodiment mode can be freely combined with the above embodiment modes. For example, surface modification may be carried out before forming the insulator 112, and the insulator 112, an upper electrode 113 and the like may be formed by a droplet discharging method.

The memory element is formed inside the contact hole and the electrode 109 functions as the lower electrode of the memory element in the present invention; further a crystallization step is not further necessary. Therefore, the number of steps can be reduced and cost can be reduced.

Embodiment Mode 8

In this embodiment mode, a structure of a device (memory device) having a memory element manufactured by the above embodiment modes, will be described.

Figure 10:
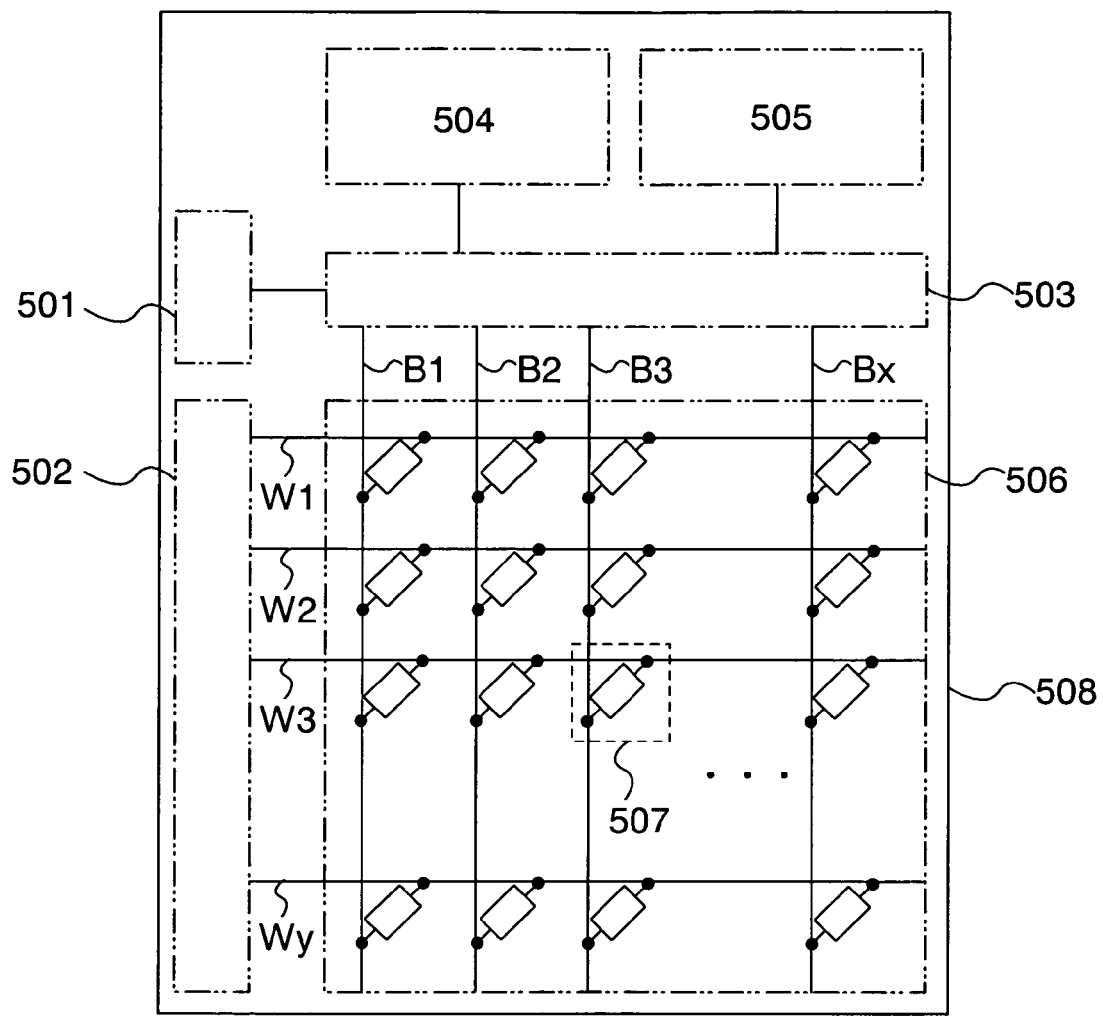
FIG. 10 is a view showing a structure of a memory element.

As shown in FIG. 10, a memory device 508 has a memory cell array 506 and a control circuit. The control circuit has a column decoder 501, a row decoder 502, a reading circuit 504, a writing circuit 505, and a selector 503.

The memory cell array 506 has a bit line Bm (m=1 to x), a word line Wn (n=1 to y), and a memory element 507 at an intersecting point of the bit line with the word line. In an aspect of the present invention, the memory element is manufactured by the above embodiment modes. In addition, the bit line is controlled by the selector 503, and the word line is controlled by the row decoder 502.

The column decoder 501 receives an address signal designating a column of the memory cell array, and a signal is given to the selector 503 of the designated column. The selector 503 receives the signal of the column decoder 501, and a bit line of the designated column is selected. The row decoder 502 receives an address signal designating a row of the memory cell array, and a word line of the designated row is selected. One memory element 507 corresponding to the address signal is selected by the above operation. The reading circuit 504 reads data which the selected memory element has, and the data is preferably amplified and outputted. The writing circuit 505 produces voltage which is necessary for writing, a short-circuit state is made by applying the voltage to the selected memory element, and the data is written in.

Figure 11:
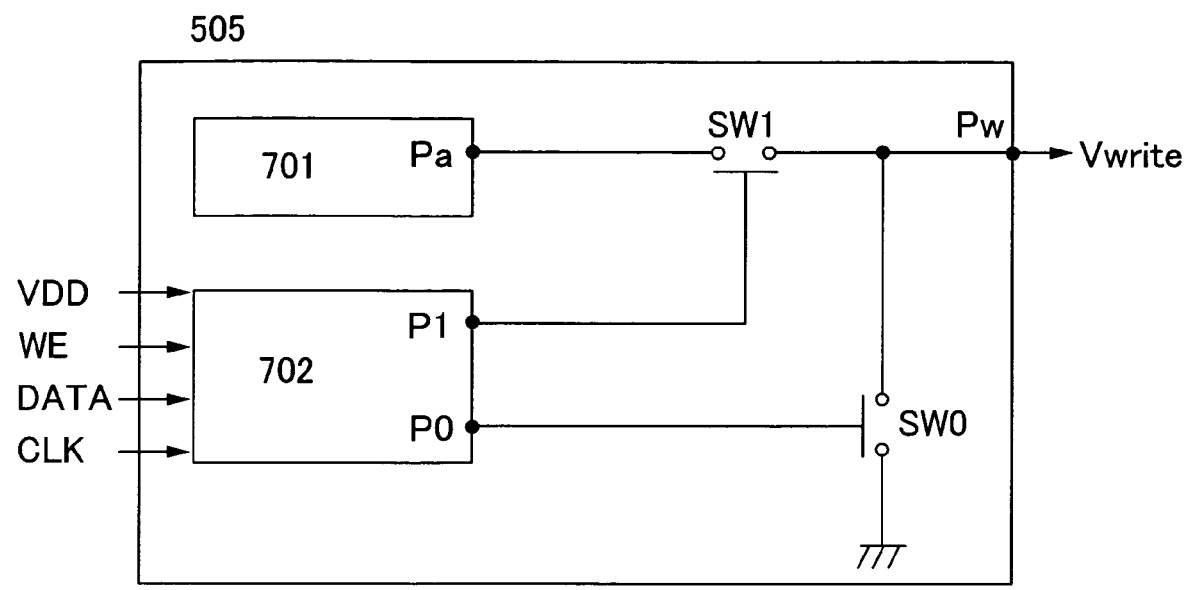
FIG. 11 is a view showing a structure of a writing circuit.

A structure of the writing circuit 505 is shown in FIG. 11. The writing circuit 505 has a voltage generating circuit 701, a timing control circuit 702, switches SW0 and SW1, and an output terminal Pw. The voltage generating circuit 701 is composed of a boosting circuit and the like, and voltage V1 which is necessary for writing is produced, and is outputted from an output Pa. The timing control circuit 702 produces signals S0 and S1 controlling the switches SW0 and SW1 respectively, from a writing control signal (WE), a data signal (DATA), a clock signal (CLK) and the like, and the signals S0 and S1 are outputted from outputs P0 and P1, respectively. Output voltage Vw from the output Pw of the writing circuit can be converted depending on any of connection status of the switch, which is a connection of the switch SW0 with the ground or a connection of the SW1 with the output Pa of the voltage generating circuit 701.

Then, writing operation in a case of an initial state "0" which does not change conductivity of a memory element and a short-circuit state "1" which changes the conductivity of the memory element, is described. When WE becomes Hi (high voltage which allows writing), the column decoder 501 which receives an address signal designating a column gives a signal to the selector 503 of the designated column, and the selector 503 connects a bit line of the designated column to the output Pw of the writing circuit. A bit line which is not designated is non-connection (floating) state, and the output voltage Vw of the writing circuit is V1. In the same way, the row decoder 502 which receives an address signal designating a row, applies voltage V2 to a word line of the designated row and applies 0V to a word line which is not designated. By the above operation, one memory element 507 corresponding to the address signal is selected. At this time, 0V is applied to an upper electrode.

At the same time, by receiving DATA=Hi, the voltage generating circuit 701 can produce voltage V1 and output the voltage V1 from the output Pa. The timing control circuit 702 can produce the signals S0 and S1 controlling the switches SW0 and SW1 from WE, DATA, CLK, power supply voltage (VDD), and the like, and output the signals S0 and S1 from the outputs P0 and P1. The switches SW0 and SW1 are converted by the signals, and the writing circuit 505 can output the voltage V1 as the output voltage Vw from the output Pw.

In the selected memory element, by the above operation, voltage V2 is applied to the word line, the voltage V1 is applied to the bit line, and 0V is applied to the upper electrode. Then, the impurity region of the thin film transistor 107 or 207 becomes conductive, and the voltage V1 of the bit line is applied to the lower electrode of the memory element. Accordingly, the conductivity of the memory element changes and becomes a short-circuit state, and "1" is written in.

When WE becomes Lo (low voltage which inhibits writing), all of the word lines become 0V, and all of the bit lines and the upper electrode become floating states. At this time, the timing control circuit produces Lo as the signals S0 and S1, and outputs them from the outputs P0 and P1. The output Pw becomes a floating state. By the above operation, writing is not performed.

Next, writing of "0" is described. The writing of "0" does not change the conductivity of the memory element, and it does not apply voltage to the memory element, in other words it is realized by maintaining an initial state. First, when WE becomes Hi in the same manner as the writing of "1", the column decoder 501 which receives the address signal designating a column gives a signal to the selector 503 of the designated column, and the selector 503 connects the bit line of the designated column to the output Pw of the writing circuit. At this time, a bit line which is not designated becomes a floating state. In the same manner, the row decoder 502 which receives the signal designating a row applies voltage V2 to the word line of the designated row, and applies 0V to a word line which is not designated. By the above operation, one memory element 507 corresponding to the address signal is selected. At this time, 0V is applied to the upper electrode.

At the same time, the timing control circuit 702 receives DATA=Lo, and generates control signals S0=H1, S1=Lo, and outputs the control signals from the outputs P0 and P1, respectively. By the control signals, the switch SW0 is turned on and the switch SW1 is turned off, and 0V is outputted as the output voltage Vw from the output Pw.

In the selected memory cell, by the above operation, the voltage V2 is applied to the word line, and 0V is applied to the bit line and a common electrode. Then, voltage is not applied to the memory element and the conductivity is not changed; therefore an initial state "0" is maintained.

When WE becomes Lo, all of the word lines become 0V, and all of the bit lines and the upper electrode become floating states. At this time, the timing control circuit produces Lo as the signals S0 and S1, and outputs them from the outputs P0 and P1, respectively. The output Pw becomes a floating state.

As described above, writing of "1" or "0" can be performed.

Figure 12:
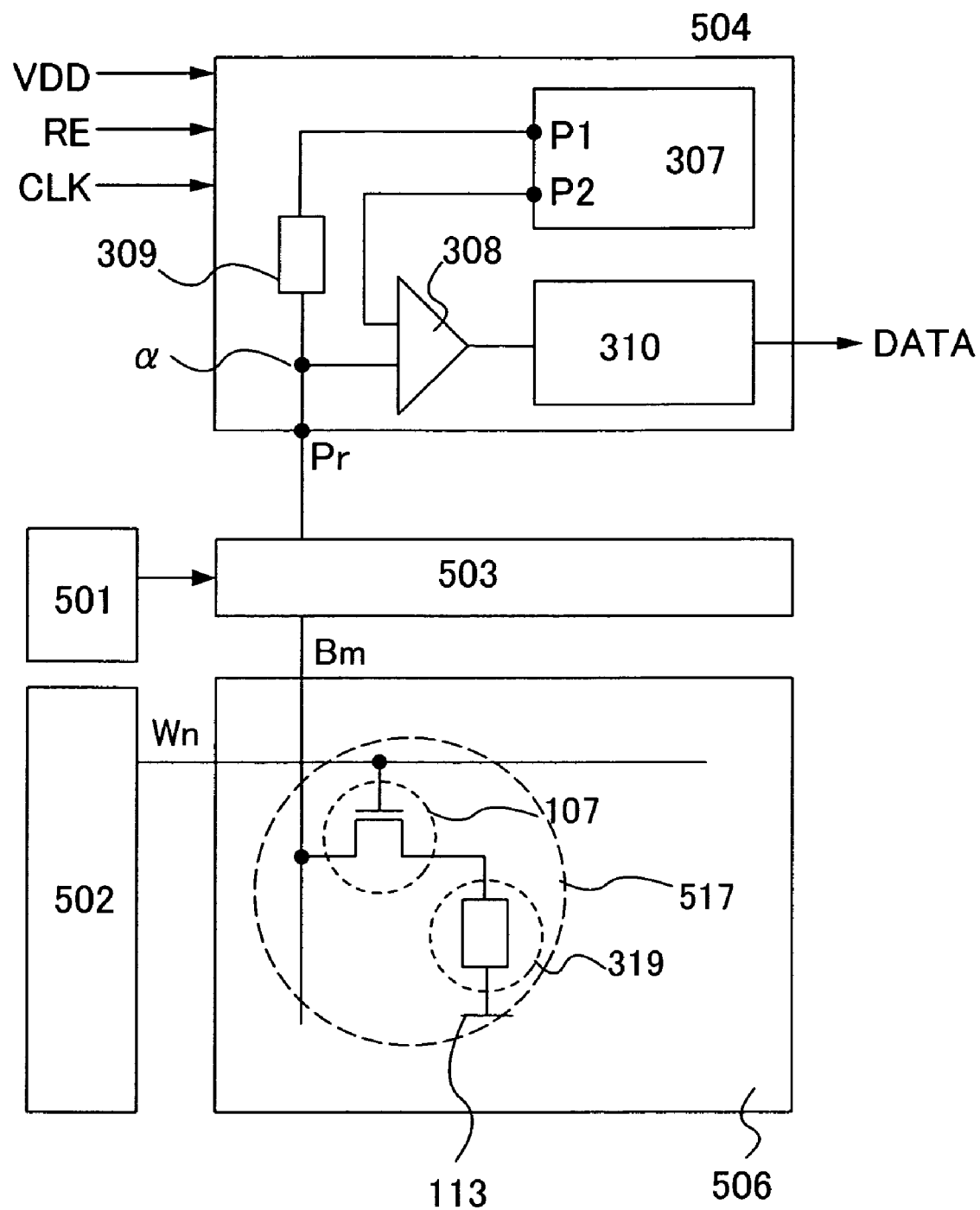
FIG. 12 is a view showing a structure of a reading circuit.

Next, reading operation is described. FIG. 12 shows a memory device in which a necessary part to describe reading is extracted, and other structures are similar to FIG. 10. The reading circuit 504 which the memory device has, has a voltage generating circuit 307, a sense amplifier 308, a resistor element 309, a data output circuit 310 and an input-output terminal Pr, and a point inputting to the sense amplifier 308 from between the resistor element 309 and the input-output terminal Pr is referred to as α.

The voltage generating circuit 307 produces voltage Vread and Vref which are necessary for the reading operation, and the voltage Vread and Vref are outputted from P1 and P2, respectively. Low voltage is used to read data; therefore power the supply voltage (VDD) can be used as the voltage Vread. The voltage Vref is lower than the voltage Vread, and is produced by a resistor division of the power supply voltage and the ground voltage. Thus, the voltage generating circuit 307 which the reading circuit 504 has, has a different structure from the voltage generating circuit which the writing circuit 505 has. The sense amplifier 308 compares the voltage difference between the point α and the voltage Vref, and outputs the result. The data output circuit 310 is controlled by a reading control signal (RE), and data which the memory element has is acquired from the output of the sense amplifier 308, and the date is amplified to be outputted.

Next, an operation to read the data which the memory element 517 has in the m-th column and the n-th row, is described. First, the column decoder 501 which receives the address signal designating a column gives a signal to the selector 503 in the m-th column, and the selector 503 connects the bit line Bm in the m-th column to the input-output terminal Pr of the reading circuit 504. At this time, a bit line which is not designated becomes a floating state. In the same manner, the row decoder 502 which receives the address signal designating a row applies voltage Vread to the word line Wn in the n-th row, and applies 0V to a word line which is not designated. At the same time, the voltage Vread and Vref are outputted from the outputs P1 and P2 of the voltage generating circuit 307, respectively, and 0V is applied to an upper electrode 113. By the above operation, a state in which the voltage Vread is applied to series resistance of a resistor element 309 and the memory element 517 is obtained, and the voltage of the point α takes a value which is divided by resistor which the resistor element 309 and the memory element 517 have.

Here, in order to describe voltage which can be taken by the point α, FIG. 15 is again referred. The voltage which can be taken by the point α corresponds to a voltage value which is a horizontal axis. A characteristic A in FIG. 15 is an I-V characteristic of the memory element in which "1" is written in, a characteristic B is an I-V characteristic of the memory element in which "0" is written in, and a characteristic C is an I-V characteristic of the thin film transistor. As for the characteristic A of the memory element in which "1" is written in, an upper electrode and a lower electrode are short-circuited and an electric resistance of the memory element is small; therefore a current value is drastically increased even when the voltage of the point α is small. On the other hand, as for the characteristic B of the memory element in which "0" is written in, the memory element shows a diode characteristic; therefore a current value finally begins to increase when the voltage of the point α takes a certain value or more. As for the characteristic C of the thin film transistor, a current value decreases when the voltage of the point α is increased, and the current value becomes 0 when the voltage of the point α is Vread.

According to FIG. 15, the voltage which can be taken by the point α can be described as follows. When "1" is written in the memory element, voltage $V_A$ of an intersecting point A of the I-V characteristic A of the memory element in which "1" is written in with the I-V characteristic C of the thin film transistor, becomes a voltage of the point α. Also, when "0" is written in the memory element, voltage $V_B$ of an intersecting point B of the I-V characteristic B of the memory element in which "0" is written in with the I-V characteristic C of the thin film transistor, becomes a voltage of the point α.

The sense amplifier 308 has a function to compare the amount of the voltage of the point α with Vref. Here, the voltage Vref is larger than the voltage $V_A$ and smaller than the voltage $V_B$, and preferably is $(V_A+V_B)/2$. In a case that the sense amplifier 308 finds the voltage of the point α is smaller than Vref by setting the voltage as described above, the voltage of the point α is considered to be the voltage $V_A$, and it shows that "1" is written in the memory element. On the other hand, in a case that the sense amplifier finds the voltage of the point α is larger than Vref, the voltage of the point α is considered to be the voltage $V_B$, and it shows that "0" is written in the memory element.

In the case that the voltage of the point α is smaller than Vref, the sense amplifier 308 outputs a signal showing "1", and in the case that the voltage of the point α is larger than Vref, the sense amplifier 308 outputs a signal showing "0". The data output circuit 310 has a function to load data from the output signal of the sense amplifier 308 in accordance with RE inputted from an exterior portion and to output the data by amplifying. By the above operation, reading can be performed.

In this embodiment mode, the resistance value of the memory element is read by replacing to the amount of the voltage, however the present invention is not limited to this. For example, a method by which the resistance value of the memory element is read by replacing to the amount of the current and a method by which the bit line is precharged, can also be adopted.

The control circuit having the memory cell array 506, the column decoder 501, the row decoder 502, the reading circuit 504, the writing circuit 505 and the selector 503, can be formed by using a transistor which is formed on a same substrate. For example, the memory cell array and the control circuit can be formed using a thin film transistor formed on a glass substrate. Also, the control circuit can be formed by using an integrated circuit (hereinafter, referred to as an IC chip) formed using a silicon wafer. In this case, the IC chip may be mounted on a substrate on which the memory cell array is formed. Especially in a case of forming the memory cell array by using a thin film transistor using an amorphous semiconductor film, the control circuit may be formed using the IC chip.

Embodiment Mode 9

In this embodiment mode, a structure of a circuit having a memory element will be described.

Figure 13A:
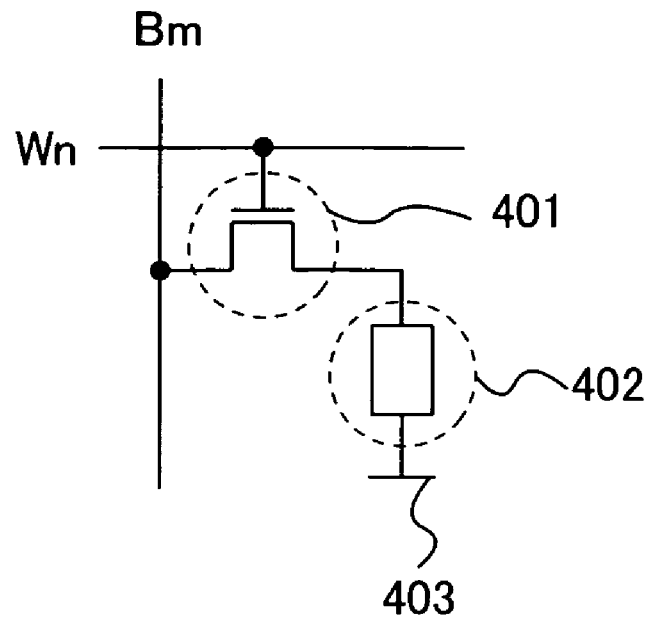
FIGS. 13A and 13B are views showing circuit structures of memory elements.

As shown in FIG. 13A, one cell of a circuit having a memory element has a transistor 401 and a memory element 402. In the transistor 401, a gate electrode is connected to a word line Wn and one of the source and drain electrodes is connected to a bit line Bm, and the other is connected to the memory element 402. As the transistor 401, the thin film transistors 107 and 207 described in the above embodiment modes can be used, and a conductive film which becomes either a source electrode or a drain electrode functions as a lower electrode of the memory element 402. As described above, the memory element 402 has a structure in which an insulator and an upper electrode are sequentially stacked over the lower electrode. An upper electrode 403 of the memory element 402 can be shared with an upper electrode of the memory element of each cell, and at the time of writing and reading, certain amount of voltage is applied.

The memory element 402 which can be selected by the transistor 401 can have an initial state and a short-circuit state, and "0" and "1" can be shown in accordance with the state.

Figure 13B:
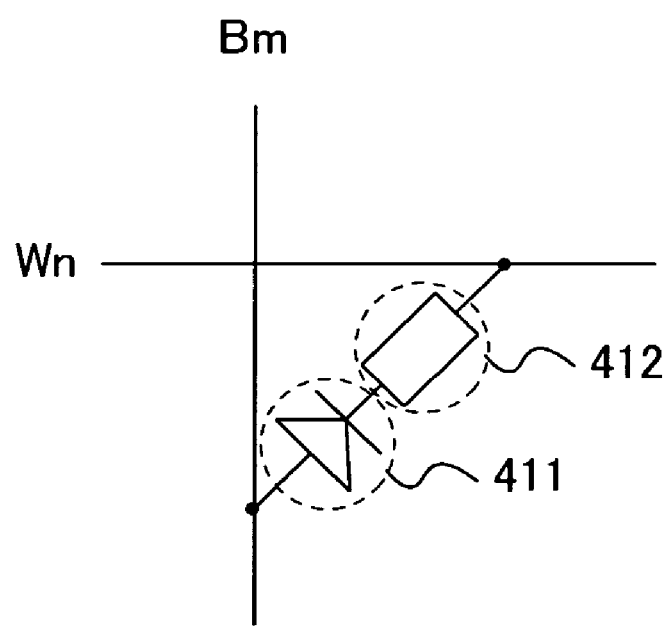

As described above, the memory element 402 may have an insulator which shows a diode characteristic which is different before and after the voltage application. Therefore, as shown in FIG. 13B, a memory element 412 may constitute a memory circuit using a cell connected to a diode element 411. A structure in which either a source electrode or a drain electrode of a transistor is connected to a gate electrode can be adopted to the diode element 411; therefore a conductive film which becomes either a source electrode or a drain electrode can function as a lower electrode of the memory element 402.

The memory element is formed inside the contact hole, and the source or drain electrode functions as the lower electrode of the memory element; therefore the number of steps can be reduced and cost can be reduced.

Embodiment Mode 10

In this embodiment mode, a mode of a semiconductor device which has a memory device, a control circuit and an antenna, and which transmits and receives information by radio, a so-called RFID, will be described.

Figure 14:
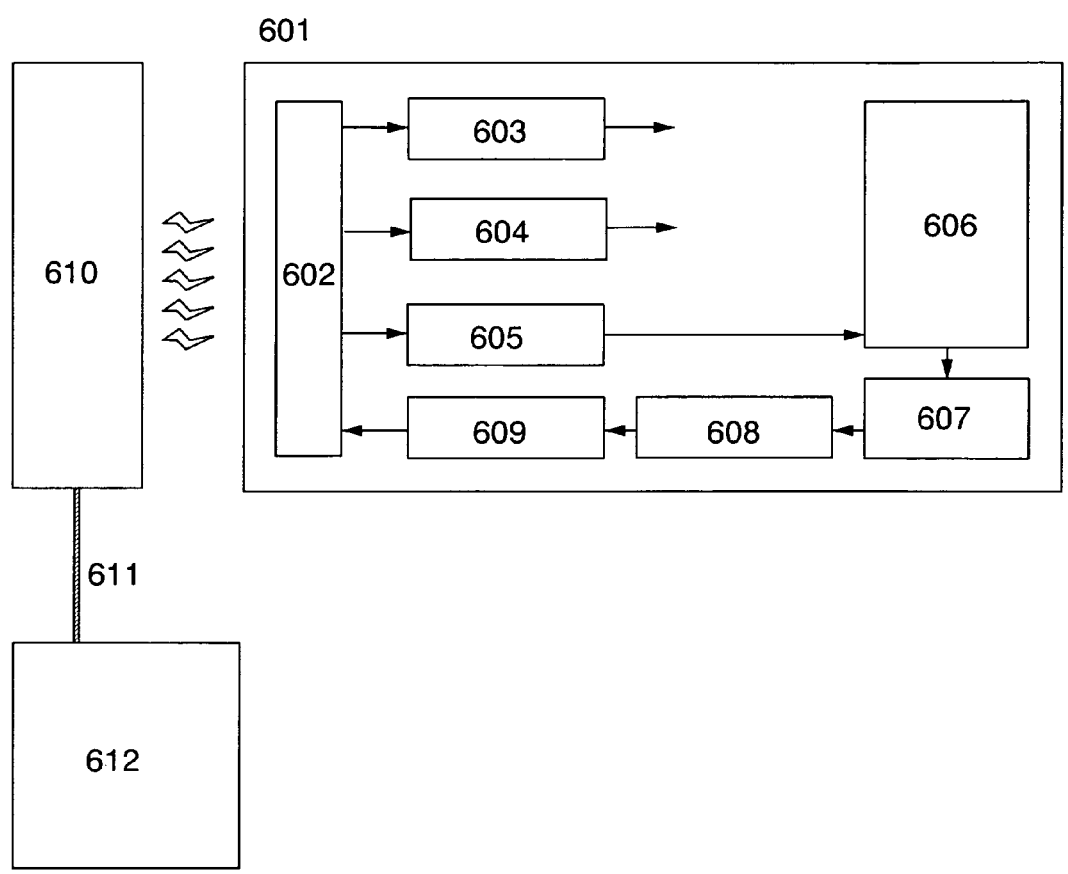
FIG. 14 is a view showing a structure of a semiconductor device.

FIG. 14 shows a structure of a semiconductor device of the present invention. A semiconductor device 601 includes a resonance circuit 602 having an antenna and a resonant capacitor; a power supply circuit 603; a clock generating circuit 604; a demodulation circuit 605; a control circuit 606; a memory device 607; an encoding circuit 608; and a modulation circuit 609. Note that the semiconductor device is not limited to the above structure, and the semiconductor device has a central processing unit (CPU), a congestion control circuit, and the like in some cases. In addition, the semiconductor device 601 is not limited to the structure having an antenna, and the semiconductor device may have only a wiring which connects an antenna. In this case, when information is transmitted to and received at the semiconductor device, an antenna which is separately provided, is used by connecting to the wiring. In other words, it is a contact type semiconductor device.

The semiconductor device 601 of the present invention has the resonance circuit 602 having an antenna; therefore electric power is supplied by a radio wave generated from a read/write 610, and information can be transmitted to and received at the read/write 610 by radio. The read/write 610 is connected to a computer 612 through a communication line 611, and electric power is supplied to the semiconductor device 601, and information is transmitted to and received at the semiconductor device 601 under the control of the computer 612.

The resonance circuit 602 receives the radio wave generated from the read/write 610, and generates induced voltage. The induced voltage includes information transmitted from the read/write 610 as well as becoming electric power of the semiconductor device 601. Power supply circuit 603 rectifies the induced voltage generated to the resonance circuit 602 in diode, and it is stabilized using a capacitor to be supplied to each circuit. The clock generating circuit 604 produces a clock signal of necessary frequency based on the induced voltage generated to the resonance circuit 602. The demodulation circuit 605 demodulates data from the induced voltage generated to the resonance circuit 602. The control circuit 606 controls the memory device 607. Therefore, the control circuit 606 includes an information determination circuit and the like which reads data from the read/write 610 as well as producing a memory control signal. The memory device 607 has a writing circuit or a reading circuit. In addition, the memory device 607 holds data which is specific to the semiconductor device 601. Here, the memory device 607 is manufactured as shown in the above embodiment modes. The encoding circuit 608 converts the data included in the memory device 607 into an encoded signal. The modulation circuit 609 modulates a carrier wave based on the encoded signal.

This embodiment mode shows an example in which electric power is supplied to the semiconductor device 601 from the read/write 610, however the present invention is not limited to this mode. For example, the semiconductor device 601 has a battery and the like inside, and the electric power is supplied by the battery, and information can be transmitted to and received at the read/write by radio.

Conductivity of even a small-sized memory element can be changed with low voltage and short voltage application time, by continuously applying voltage of multiple steps to the memory element. Also, consumption current at a time of writing can be reduced, and the time when the current consumption becomes a maximum level can be shortened by a means of the present invention; therefore a downsized voltage generating circuit and a downsized semiconductor device which the writing circuit has, can be realized. When high pulse voltage is applied to a memory element, variation in a variation amount of the conductivity is occurred, and the reliability of the semiconductor device is decreased. However, by continuously applying the voltage of the multiple steps like the present invention, the variation amount of the conductivity of the memory element becomes constant, and the reliability of the semiconductor device can be increased. Furthermore, an organic compound is used for a material for the memory element in the present invention; therefore a semiconductor device can be manufactured over a large-sized glass substrate or a flexible substrate with a low-temperature process, and an inexpensive semiconductor device can be provided.

Note that this embodiment mode can be freely combined with the above embodiment modes.

The memory element is formed inside the contact hole, and the source or drain electrode functions as the lower electrode of the memory element; therefore the number of steps can be reduced and cost can be reduced.

The invention claimed is:

1. A memory device comprising:
a semiconductor film comprising a first impurity region and a second impurity region provided over an insulated surface;
a first insulating film over the semiconductor film;
a second insulating film over the first insulating film;
a first opening portion formed in the first insulating film and the second insulating film over the first impurity region;
a second opening portion formed in the first insulating film and the second insulating film over the second impurity region;
a first conductive film functioning as one of a source electrode and a drain electrode electrically connected to the first impurity region at the first opening portion and functioning as a lower electrode, wherein the first conductive film is provided over the second insulating film and is extended into the first opening portion to be in contact with a side surface of the first insulating film and a side surface of the second insulating film;
a second conductive film functioning as the other of the source electrode and the drain electrode electrically connected to the second impurity region at the second opening portion, wherein the second conductive film is provided over the second insulating film and is extended into the second opening portion;
an insulator provided over the first conductive film at the first opening portion and over the second conductive film at the second opening portion; and
an upper electrode provided over the insulator and in the first opening portion and the second opening portion,
wherein an edge of the first conductive film and an edge of the second conductive film are in contact with the second insulating film.

2. A device according to claim 1, wherein a property of the insulator is changed by an optical effect or a thermal effect,
wherein the insulator can short-circuit the lower electrode and the upper electrode, and
wherein the insulator comprises a material selected from the group consisting of silicon oxide, silicon nitride and silicon oxynitride.

3. A device according to claim 1, wherein a property of the insulator is changed by an optical effect or a thermal effect,
wherein the insulator can short-circuit the lower electrode and the upper electrode, and
wherein the insulator comprises a material selected from the group consisting of
4,4'-bis[N-(1-naphthyl)-N-phenylamino]biphenyl,
4,4'-bis[N-(3-methylphenyl)-N-phenylamino]biphenyl,
4,4'4''-tris(N,N-diphenylamino)triphenylamine,
4,4'4''-tris[N-(3-methylphenyl)-N-phenylamino]triphenylamine,
4,4'-bis[N-{4-(N,N-di-m-tolylamino)phenyl}-N-phenylamino]biphenyl,
polyvinylcarbazole, phthalocyanine, copper phthalocyanine, and vadadyl phthalocyanine.

4. A device according to claim 1, wherein a plurality of sets of the first and second opening portions are provided over the first and second impurity regions.

5. A device according to claim 1, wherein the semiconductor film has a crystalline structure or an amorphous structure.

6. A device according to claim 1 wherein the insulator has a thickness of 5 nm to 100 nm.

7. A device according to claim 1 wherein the first opening portion has a diameter of 1 to 3 μm.

8. A memory device comprising:
a semiconductor film comprising an impurity region provided over an insulated surface;
a first insulating film over the semiconductor film;
a second insulating film over the first insulating film;
a first opening portion formed in the first insulating film and the second insulating film over the impurity region;
a first conductive film functioning as a source or drain electrode connected to the impurity region and functioning as a lower electrode, wherein the first conductive film is provided over the second insulating film and is extended into the first opening portion to be in contact with a side surface of the first insulating film and a side surface of the second insulating film;
a third insulating film which is provided over the second insulating film so as to cover an edge of the first conductive film and provided with a second opening portion over the impurity region;
an insulator provided over the first conductive film and the third insulating film, and provided in the first opening portion and the second opening portion; and
an upper electrode provided over the insulator.

9. A device according to claim 8, wherein a property of the insulator is changed by an optical effect or a thermal effect,
wherein the insulator can short-circuit the lower electrode and the upper electrode, and
wherein the insulator comprises a material selected from the group consisting of silicon oxide, silicon nitride and silicon oxynitride.

10. A device according to claim 8, wherein a property of the insulator is changed by an optical effect or a thermal effect,
wherein the insulator can short-circuit the lower electrode and the upper electrode, and
wherein the insulator comprises a material selected from the group consisting of
4,4'-bis[N-(1-naphthyl)-N-phenylamino]biphenyl,
4,4'-bis[N-(3-methylphenyl)-N-phenylamino]biphenyl,
4,4'4''-tris(N,N-diphenylamino)triphenylamine,
4,4'4''-tris[N-(3-methylphenyl)-N-phenylamino]triphenylamine,
4,4'-bis[N-{4-(N,N-di-m-tolylamino)phenyl}-N-phenylamino]biphenyl,
polyvinylcarbazole, phthalocyanine, copper phthalocyanine, and vadadyl phthalocyanine.

11. A device according to claim 8, wherein a plurality of sets of the first and second opening portions are provided over the impurity region.

12. A device according to claim 8, wherein the semiconductor film has a crystalline structure or an amorphous structure.

13. A device according to claim 8 wherein the insulator has a thickness of 5 nm to 100 nm.

14. A device according to claim 8 wherein each of the first and second opening portions has a diameter of 1 to 3 μm.

15. A memory device comprising:
a semiconductor film comprising a first impurity region and a second impurity region provided over an insulated surface;
a first insulating film over the semiconductor film;
a second insulating film over the first insulating film;
a first opening portion formed in the first insulating film and the second insulating film over the first impurity region;
a second opening portion formed in the first insulating film and the second insulating film over the second impurity region; and a memory element comprising a lower electrode, an insulator and an upper electrode,
wherein the lower electrode is provided over the second insulating film and is extended into the first opening portion to be in contact with a side surface of the first insulating film and a side surface of the second insulating film,
wherein the insulator is provided over the lower electrode and in the first opening portion,
wherein the upper electrode is provided over the insulator and in the first opening portion,
wherein the lower electrode is provided adjacent to the first impurity region so that the lower electrode functions as one of a source electrode and a drain electrode electrically connected to the first impurity region,
wherein a conductive film is provided adjacent to the second impurity region so that the conductive film functions as the other of the source electrode and the drain electrode electrically connected to the second impurity region,
wherein the insulator is provided over the conductive film and in the second opening portion,
wherein the upper electrode is provided over the insulator and in the second opening portion,
wherein an edge of the lower electrode and an edge of the conductive film are in contact with the second insulating film.

16. A device according to claim 15, wherein a property of the insulator is changed by an optical effect or a thermal effect,
wherein the insulator can short-circuit the lower electrode and the upper electrode, and
wherein the insulator comprises a material selected from the group consisting of silicon oxide, silicon nitride and silicon oxynitride.

17. A device according to claim 15, wherein a property of the insulator is changed by an optical effect or a thermal effect,
wherein the insulator can short-circuit the lower electrode and the upper electrode, and
wherein the insulator comprises a material selected from the group consisting of
4,4'-bis[N-(1-naphthyl)-N-phenylamino]biphenyl,
4,4'-bis[N-(3-methylphenyl)-N-phenylamino]biphenyl,
4,4'4"-tris(N,N-diphenylamino)triphenylamine,
4,4'4"-tris[N-(3-methylphenyl)-N-phenylamino]triphenylamine,
4,4'-bis[N-{4-(N,N-di-m-tolylamino)phenyl}-N-phenylamino]biphenyl,
polyvinylcarbazole, phthalocyanine, copper phthalocyanine, and vadadyl phthalocyanine.

18. A device according to claim 15, wherein a plurality of sets of the first and second opening portions are provided over the first and second impurity regions.

19. A device according to claim 15, wherein the semiconductor film has a crystalline structure or an amorphous structure.

20. A device according to claim 15 wherein the insulator has a thickness of 5 nm to 100 nm.

21. A device according to claim 15 wherein the first opening portion has a diameter of 1 to 3 μm.

22. A memory device comprising:
a semiconductor film comprising a first impurity region and a second impurity region provided over an insulated surface;
a first insulating film over the semiconductor film;
a second insulating film over the first insulating film;
a first opening portion formed in the first insulating film and the second insulating film over the first impurity region;
a second opening portion formed in the first insulating film and the second insulating film over the second impurity region;
a first conductive film functioning as one of a source electrode and a drain electrode electrically connected to the first impurity region at the first opening portion and functioning as a lower electrode, wherein the first conductive film is provided over the second insulating film and is extended into the first opening portion to be in contact with a side surface of the first insulating film and a side surface of the second insulating film;
a second conductive film functioning as the other of the source electrode and the drain electrode electrically connected to the second impurity region at the second opening portion, wherein the second conductive film is provided over the second insulating film and is extended into the second opening portion;
an insulator provided over the first conductive film at the first opening portion; and
an upper electrode provided over the insulator,
wherein an edge of the first conductive film and an edge of the second conductive film are in contact with the second insulating film, and
wherein a plurality of sets of the first and second opening portions are provided over the first and second impurity regions.

23. A device according to claim 22, wherein a property of the insulator is changed by an optical effect or a thermal effect,
wherein the insulator can short-circuit the lower electrode and the upper electrode, and
wherein the insulator comprises a material selected from the group consisting of silicon oxide, silicon nitride and silicon oxynitride.

24. A device according to claim 22, wherein a property of the insulator is changed by an optical effect or a thermal effect,
wherein the insulator can short-circuit the lower electrode and the upper electrode, and
wherein the insulator comprises a material selected from the group consisting of
4,4'-bis[N-(1-naphthyl)-N-phenylamino]biphenyl,
4,4'-bis[N-(3-methylphenyl)-N-phenylamino]biphenyl,
4,4'4"-tris(N,N-diphenylamino)triphenylamine,
4,4'4"-tris[N-(3-methylphenyl)-N-phenylamino]triphenylamine,
4,4'-bis[N-{4-(N,N-di-m-tolylamino)phenyl}-N-phenylamino]biphenyl,
polyvinylcarbazole, phthalocyanine, copper phthalocyanine, and vadadyl phthalocyanine.

25. A device according to claim 22, wherein the semiconductor film has a crystalline structure or an amorphous structure.

26. A device according to claim 22 wherein the insulator has a thickness of 5 nm to 100 nm.

27. A device according to claim 22 wherein the first opening portion has a diameter of 1 to 3 μm.

28. A memory device comprising:
a semiconductor film comprising a first impurity region and a second impurity region provided over an insulated surface;
a first insulating film over the semiconductor film;
a second insulating film over the first insulating film;

a first opening portion formed in the first insulating film and the second insulating film over the first impurity region;

a second opening portion formed in the first insulating film and the second insulating film over the second impurity region;

a first conductive film functioning as one of a source electrode and a drain electrode electrically connected to the first impurity region at the first opening portion and functioning as a lower electrode, wherein the first conductive film is provided over the second insulating film and is extended into the first opening portion to be in contact with a side surface of the first insulating film and a side surface of the second insulating film;

a second conductive film functioning as the other of the source electrode and the drain electrode electrically connected to the second impurity region at the second opening portion, wherein the second conductive film is provided over the second insulating film and is extended into the second opening portion;

an insulator provided over the first conductive film at the first opening portion and over the second conductive film at the second opening portion; and an upper electrode provided over the insulator at the first opening portion and the second opening portion, wherein an edge of the first conductive film and an edge of the second conductive film are in contact with the second insulating film, and wherein a plurality of sets of the first and second opening portions are provided over the first and second impurity regions.

29. A device according to claim 28, wherein a property of the insulator is changed by an optical effect or a thermal effect,
wherein the insulator can short-circuit the lower electrode and the upper electrode, and
wherein the insulator comprises a material selected from the group consisting of silicon oxide, silicon nitride and silicon oxynitride.

30. A device according to claim 28, wherein a property of the insulator is changed by an optical effect or a thermal effect,
wherein the insulator can short-circuit the lower electrode and the upper electrode, and
wherein the insulator comprises a material selected from the group consisting of
4,4'-bis[N-(1-naphthyl)-N-phenylamino]biphenyl,
4,4'-bis[N-(3-methylphenyl)-N-phenylamino]biphenyl,
4,4'4"-tris(N,N-diphenylamino)triphenylamine,
4,4'4"-tris[N-(3-methylphenyl)-N-phenylamino]triphenylamine,
4,4'-bis[N-{4-(N,N-di-m-tolylamino)phenyl}-N-phenylamino]biphenyl,
polyvinylcarbazole, phthalocyanine, copper phthalocyanine, and vadadyl phthalocyanine.

31. A device according to claim 28, wherein the semiconductor film has a crystalline structure or an amorphous structure.

32. A device according to claim 28 wherein the insulator has a thickness of 5 nm to 100 nm.

33. A device according to claim 28 wherein the first opening portion has a diameter of 1 to 3 μm.

* * * * *